United States Patent
Jeong et al.

(10) Patent No.: US 10,453,507 B2
(45) Date of Patent: Oct. 22, 2019

(54) ELECTRONIC DEVICE COMPRISING STORAGE DEVICES TRANSMITTING REFERENCE CLOCK VIA CASCADE COUPLING STRUCTURE

(71) Applicant: Samsung Electronics Co., Ltd., Suwon-si, Gyeonggi-do (KR)

(72) Inventors: Yongwoo Jeong, Bucheon-si (KR); Hwaseok Oh, Yongin-si (KR); JinHyeok Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/685,654

(22) Filed: Aug. 24, 2017

(65) Prior Publication Data
US 2018/0090191 A1   Mar. 29, 2018

(30) Foreign Application Priority Data

Sep. 23, 2016   (KR) .......................... 10-2016-0122402

(51) Int. Cl.
| | |
|---|---|
| *G11C 7/22* | (2006.01) |
| *G11C 7/10* | (2006.01) |
| *G11C 16/08* | (2006.01) |
| *G11C 16/32* | (2006.01) |
| *G11C 29/02* | (2006.01) |
| *G11C 8/12* | (2006.01) |
| *G11C 29/50* | (2006.01) |

(52) U.S. Cl.
CPC .................. *G11C 7/22* (2013.01); *G11C 7/10* (2013.01); *G11C 7/1045* (2013.01); *G11C 7/222* (2013.01); *G11C 16/08* (2013.01); *G11C 16/32* (2013.01); *G11C 29/023* (2013.01); *G11C 29/028* (2013.01); *G11C 8/12* (2013.01); *G11C 29/50012* (2013.01)

(58) Field of Classification Search
CPC ....... G11C 7/22; G11C 29/028; G11C 29/023; G11C 7/222; G11C 7/1045; G11C 7/10; G11C 16/32; G11C 16/08; G11C 8/12; G11C 29/50012
See application file for complete search history.

(56) References Cited

U.S. PATENT DOCUMENTS

| | | | |
|---|---|---|---|
| 5,546,023 | A | 8/1996 | Borkar et al. |
| 6,944,697 | B2 | 9/2005 | Andreas |
| 7,380,152 | B2 | 5/2008 | Chung |
| 7,652,922 | B2 | 1/2010 | Kim et al. |
| 7,770,047 | B2 | 8/2010 | Kelly |
| 7,966,443 | B2 | 6/2011 | Grundy et al. |
| 8,139,390 | B2 | 3/2012 | Oh |
| 8,527,824 | B2 | 9/2013 | Bahl et al. |

(Continued)

*Primary Examiner* — John W Poos
(74) *Attorney, Agent, or Firm* — Harness, Dickey & Pierce, P.L.C.

(57) ABSTRACT

Disclosed is an electronic device which includes an application processor configured to generate a reference clock, a first storage device configured to receive the reference clock from the application processor through a clock input port, to output the reference clock to a clock output port, and to communicate with the application processor by using the reference clock, and a second storage device configured to receive the reference clock from the clock output port and use the reference clock for communication with the first storage device.

20 Claims, 18 Drawing Sheets

(56) References Cited

U.S. PATENT DOCUMENTS

| | | |
|---|---|---|
| 8,539,143 B2 | 9/2013 | Choi et al. |
| 8,582,382 B2 | 11/2013 | Oh |
| 9,100,167 B2 | 8/2015 | Garg et al. |
| 9,240,227 B2 | 1/2016 | Pyeon et al. |
| 2004/0148482 A1* | 7/2004 | Grundy .................. G06F 12/06 711/167 |
| 2006/0047990 A1 | 3/2006 | James et al. |
| 2010/0005218 A1 | 1/2010 | Gower et al. |

* cited by examiner

ELECTRONIC DEVICE COMPRISING STORAGE DEVICES TRANSMITTING REFERENCE CLOCK VIA CASCADE COUPLING STRUCTURE

CROSS-REFERENCE TO RELATED APPLICATION(S)

This U.S. non-provisional application claims the benefit of priority under 35 U.S.C. § 119 to Korean Patent Application No. 10-2016-0122402, filed Sep. 23, 2016, in the Korean Intellectual Property Office (KIPO), the entire contents of which are hereby incorporated by reference.

BACKGROUND

Various example embodiments of the inventive concepts disclosed herein relate to an electronic device, and more particularly, to an electronic device that includes storage devices transmitting a reference clock for high-speed data transmission via a cascade coupling structure.

Currently, various kinds of electronic devices are being used that perform functionality based on the operations of various electronic circuits included therein. Accordingly, the electronic device performs various functions to provide a service to a user and/or may communicate with an external electronic device to provide the service.

An operation processor and a storage device are some examples of electronic devices. For example, the operation processor may communicate (or interface) with the storage device to provide a data storage service to a user. The operation processor may exchange data/information/signals/packets with the storage device while interfacing with the storage device. The operation processor and the storage device may adopt the interface protocol to communicate with each other.

As demand for electronic devices having higher performance and efficiency increases, a configuration and an interface way of the electronic device have evolved. For example, various circuit configurations and operation methods have been developed to implement a storage device having larger data storage capacities. In some cases, however, to change a circuit configuration and an operation method to satisfy user requirements may cause an increase in costs, configuration complexity, and integrated circuit area.

SUMMARY

Various example embodiments of the inventive concepts provide storage devices that transmit a reference clock of high reliability and quality while having relatively low complexity.

According to an aspect of at least one example embodiment, an electronic device includes at least one application processor configured to generate a reference clock signal, a first storage device configured to receive the reference clock signal from the application processor through a first clock input port, output the reference clock signal to a first clock output port, and communicate with the application processor based on the reference clock signal, and a second storage device configured to receive the reference clock signal from the first clock output port through a second output port, and communicate with the first storage device using the reference clock signal.

According to another aspect of at least one example embodiment, an electronic device includes at least one application processor, a first storage device configured to communicate with the application processor, communicate with the application processor, generate a reference clock signal using an oscillator, and output the reference clock signal to a clock output port, and a second storage device configured to receive the reference clock signal from the clock output port, and communicate with the first storage device using the reference clock signal, wherein the application processor is configured to communicate with the second storage device through the first storage device.

According to another aspect of at least one example embodiment, an electronic device includes a first storage device configured to generate a driving clock signal based on a reference clock, and transmit the driving clock signal to a first clock output port, the generating including generating the driving clock signal when the reference clock is not provided to the first clock input port, and a second storage device configured to communicate with the first storage device using the driving clock signal output through the first clock output port.

According to another aspect of at least one example embodiment, an electronic device includes at least one processor configured to generate a first reference clock signal, and a first storage device serially connected to the processor and at least one second storage device, the first storage device configured to receive a command or query from the at least one processor, determine an access mode related to the at least one second storage device based on the received command or query, based on results of the determination, transmitting a second reference clock signal to the at least one second storage device, and the at least one second storage device is configured to perform data communication based on the received second reference clock signal.

BRIEF DESCRIPTION OF THE FIGURES

The foregoing and other features of inventive concepts will be apparent from the more particular description of non-limiting example embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
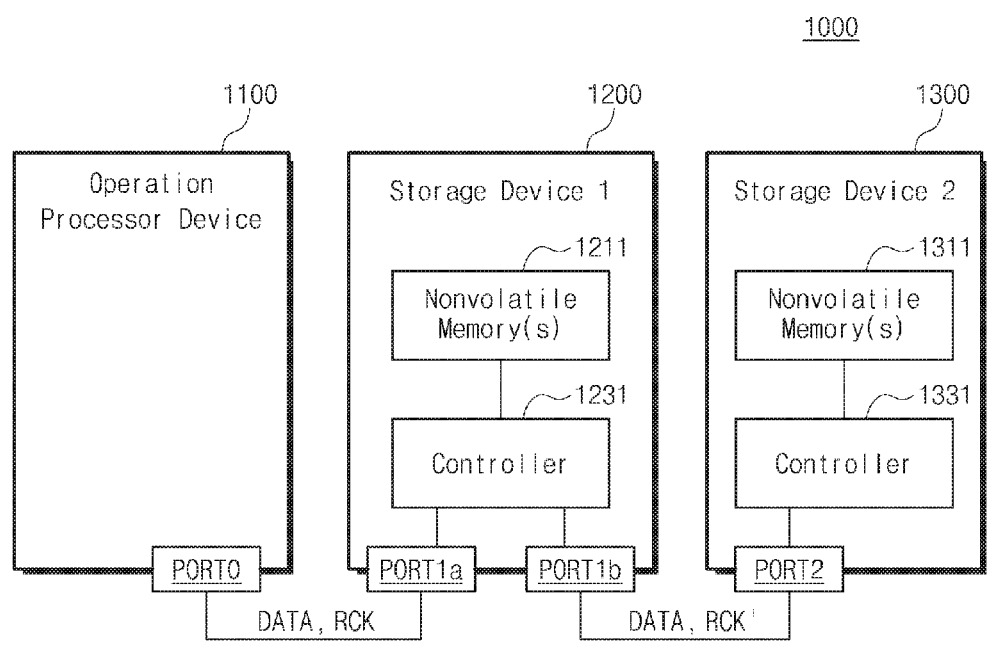
FIG. 1 is a block diagram illustrating a storage system including serially connected storage devices, according to at least one example embodiment of the inventive concepts.

Various example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

FIG. 1 is a block diagram illustrating a storage system 1000 including a plurality of serially connected storage devices according to at least one example embodiment of the inventive concepts. The storage system 1000 may include an operation processor device 1100, a first storage device 1200, and a second storage device 1300, etc., but is not limited thereto.

The operation processor device 1100 may manage and process the overall operations of the storage system 1000. The operation processor device 1100 may perform various arithmetic operations/logical operations. For example, the operation processor device 1100 may include one or more processor cores and/or may be a multi-processor system, a distributed processing system, etc. The operation processor device 1100 may be implemented to include dedicated circuits (e.g., field programmable gate arrays (FPGA) and application specific integrated circuits (ASICs)) or may be implemented with a system on chip (SoC). For example, the operation processor device 1100 may include a general-purpose processor, a dedicated processor, or an application processor. The operation processor device 1100 may be a processor itself or may be an electronic device or system including a processor.

The first storage device 1200 may include one or more nonvolatile memories 1211 and a controller 1231, but is not limited thereto. The second storage device 1300 may include one or more nonvolatile memories 1311 and a controller 1331, but is not limited thereto.

The nonvolatile memories 1211 and 1311 may include one or more memory areas for storing data. For example, in the case where the nonvolatile memories 1211 and 1311 include NAND flash memories, each of the nonvolatile memories 1211 and 1311 may include an array of memory cells formed along a plurality of word lines and a plurality of bit lines.

However, the example embodiments of the inventive concepts may not be limited thereto. For example, each of the nonvolatile memories 1211 and 1311 may include one or more of various nonvolatile memories, such as, a phase-change random access memory (PRAM), a magneto-resistive RAM (MRAM), a resistive RAM (ReRAM), a ferro-electric RAM (FRAM), hard disk drives, optical drives, magnetic drives, etc. To help understanding, in the following description, it may be assumed that the nonvolatile memories 1211 and 1311 include NAND flash memories, but configurations of the nonvolatile memories 1211 and 1311 may be variously changed or modified.

Each of the controllers 1231 and 1331 may control overall operations of a corresponding one of the storage devices 1200 and 1300. To this end, each of the controllers 1231 and 1331 may include one or more processor cores and a buffer memory, etc. For example, the controllers 1231 and 1331 may control the nonvolatile memories 1211 and 1311, respectively. Under control of the controllers 1231 and 1331, data may be stored in the nonvolatile memories 1211 and 1311, or data stored in the nonvolatile memories 1211 and 1311 may be output.

The operation processor device 1100 may provide a command and/or a query to the storage devices 1200 and 1300. The operation processor device 1100 may exchange data with the storage devices 1200 and 1300. In some example embodiments, commands, queries, and/or data may be transferred in units of packets (e.g., the commands, queries, and/or data may be packetized and transmitted as packet traffic). However, example embodiments of the inventive concepts may not be limited thereto.

For example, in the case where the operation processor device 1100 provides a write command and write data to the storage devices 1200 and 1300, the storage devices 1200 and 1300 may store the write data in the nonvolatile memories 1211 and 1311. For example, in the case where the operation processor device 1100 provides a read command to the storage devices 1200 and 1300, the storage devices 1200 and 1300 may output read data stored in the nonvolatile memories 1211 and 1311.

The operation processor device 1100 may be a host device that is provided with a storage service from a plurality of storage devices, such as the storage devices 1200 and 1300 (and/or other storage devices). A user of the storage system 1000 may be provided with the storage device as the operation processor device 1100 operates.

According to at least one example embodiment of the inventive concepts, the operation processor device 1100 and the storage devices 1200 and 1300 may be coupled to each other in a cascade manner, or in other words, the output of a first device is transmitted to the input of the second device, and the output of the second device is transmitted to the input of the third device, etc. Referring to FIG. 1, the operation processor device 1100 may be connected to directly communicate with the first storage device 1200 through ports PORT0 and PORT1a for example. That is, the operation processor device 1100 may exchange data and/or a control signal with the first storage device 1200 through ports PORT0 and PORT1a, and may transmit a reference clock RCK as well. The first storage device 1200 may be connected to directly communicate with the second storage device 1300 through ports PORT1b and PORT2. That is, the first storage device 1200 may exchange data and/or a control signal with the second storage device 1300 through ports PORT1b and PORT2, and may transmit a reference clock RCK' also. Here, the reference clocks RCK and RCK' may be a clock signal that is generated by the same oscillation source. Also, the reference clocks RCK and RCK' may be different clock signals that are respectively generated by different oscillation sources (e.g., the operation processor device 1100 and the storage device 1200, respectively).

The operation processor device 1100 may pass messages through the ports PORT1a and PORT1b of the first storage device 1200 for communication with the second storage device 1300. That is, the operation processor device 1100 and the storage devices 1200 and 1300 may be connected to each other by the topology of a chain structure (e.g., a daisy chain structure), a cascade structure, be wired in series, etc.

For example, to exchange read data and write data with the operation processor device 1100, the controller 1231 may be configured to directly communicate with the operation processor device 1100. Additionally, to exchange read data and write data, the controllers 1231 and 1331 of the storage device 1200 and the storage device 1300 may be configured to directly communicate with each other. In contrast, the controller 1331 may not be directly connected to the operation processor device 1100 and/or is not able to directly communicate with the operation processor device 1100.

According to the example embodiment illustrated in FIG. 1, the operation processor device 1100 may not directly communicate with the second storage device 1300. Accordingly, the operation processor device 1100 may only include the port PORT0 connected with the first storage device 1200, a communication circuit for communication with the first storage device 1200, and a peripheral circuit driving/controlling the communication circuit. Additionally, the first storage device 1200 may include the port PORT1b connected with the second storage device 1300, a communication circuit for communication with the second storage device 1300, and a peripheral circuit driving/controlling the communication circuit according to at least one example embodiment.

According to the example embodiment illustrated in FIG. 1, the physical configuration of the operation processor device 1100 may be simplified, and the physical area occupied by the operation processor device 1100 on a semiconductor chip may decrease because of the decreased complexity of the system of FIG. 1. In addition, the costs required to design/manufacture/test the operation processor device 1100 may decrease. In addition to the above-described economic benefits, the adoption of the two storage devices 1200 and 1300 may provide a larger storage capacity than the use of a single storage device. Accordingly, the user requirements and system requirements may be satisfied.

In at least one example embodiment, the configuration of the first storage device 1200 may become more complicated somewhat. However, in many cases, the operation processor device 1100 may operate at a speed of several or tens of gigahertz (GHz), and the first storage device 1200 may operate at a speed of several to tens of megahertz (MHz). In addition, the process for manufacturing the operation processor device 1100 may be more difficult and complex than the process of manufacturing the first storage device 1200. Accordingly, it may be more beneficial, simple and economical to implement the port PORT1b, the communication circuit, and the peripheral circuit in the first storage device 1200, rather than incorporating them into the operation processor device 1100.

The above-described structure of the storage system 1000 may make it possible to improve the reliability and quality of the reference clock RCK supplied from the operation processor device 1100 to the storage device 1200. That is, when the reference clock RCK is supplied to the storage devices 1200 and 1300 via a bus topology structure, the reference clock RCK is simultaneously transmitted to a plurality of devices. However, in one storage device, a transmission line for transmitting the reference clock RCK of another storage device may cause noise due to reflection and/or leakage of the clock signal. In addition, if a specific storage device is in certain states, such as a power saving mode, in an off state, etc., a transmission line receiving a reference clock may act as an uncontrollable parasitic stub resistance. If a reference clock is transmitted and/or supplied in the cascade manner according to at least one example embodiment of the inventive concepts discussed below, it may be possible to supply the reference clock having high quality and high flexibility while solving the above-described parasitic stub resistance issue.

The reference clock RCK supplied to the storage device 1200 may be a clock signal that is generated by the operation processor device 1100. For example, the operation processor device 1100 may generate the reference clock RCK by using an oscillation element which generates an oscillation signal with a stable frequency, and a phase locked loop (PLL). The oscillation element may be a temperature compensated crystal oscillator TCXO that generates an oscillation signal with a stable frequency even in various environments.

In at least one other example embodiment, the operation processor device 1100 may provide the reference clock RCK provided from the outside (e.g., an external reference clock) to the storage device 1200 in a bypass manner. An element such as the temperature compensated crystal oscillator TCXO for generating a stable oscillation signal occupies a large chip area, so the operation processor device 1100 may receive the reference clock RCK from a dedicated external device for generating a clock of high accuracy, and may simply transmit the received reference clock RCK to the storage device 1200 instead of generating a reference clock itself.

In another example embodiment, the operation processor device 1100 may adjust the reference clock RCK provided externally (e.g., from an outside device) to a clock signal of a more accurate frequency, and may transmit the adjusted reference clock RCK to the storage device 1200. That is, the operation processor device 1100 may receive the reference clock RCK from the dedicated device for generating a clock of high accuracy and may transmit the reference clock RCK to the storage device 1200 after stabilizing the received reference clock RCK through the phase locked loop PLL, but is not limited thereto.

The operation processor device 1100 and the storage devices 1200 and 1300 may communicate with each other based on one or more interface protocols. For example, the operation processor device 1100 and the storage devices 1200 and 1300 may adopt at least one serial interface protocol, such as, but not limited to, universal serial bus (USB), small computer system interface (SCSI), peripheral component interconnect express (PCIe), nonvolatile memory express (NVMe), serial advanced technology attachment (SATA), serial attached SCSI (SAS), secure digital (SD) card, embedded multimedia card (eMMC), and universal flash storage (UFS), etc., so as to communicate with each other.

FIGS. 2A to 2D are conceptual diagrams illustrating implementations of the storage system 1000 of FIG. 1.

Figure 2A:
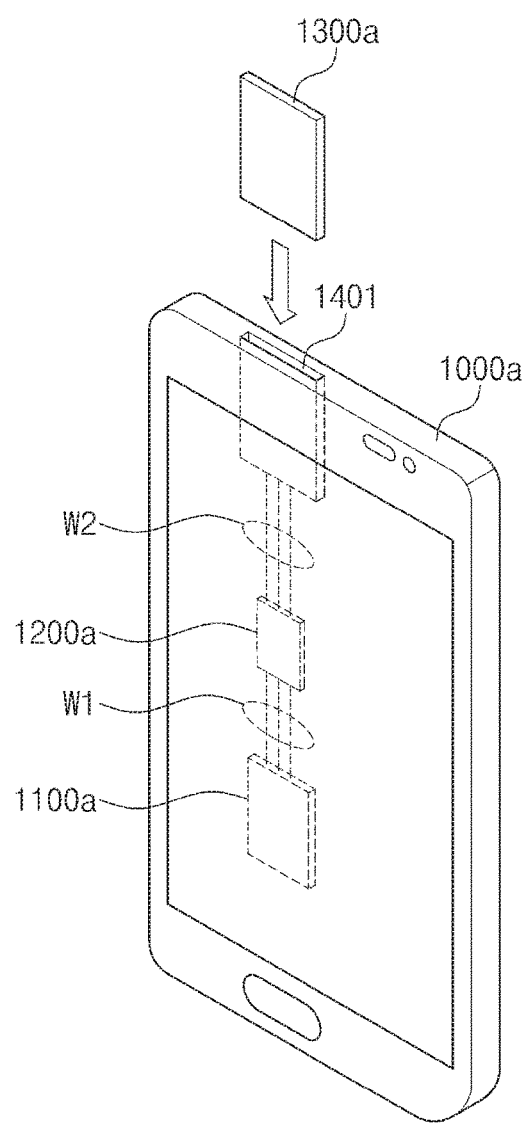
FIGS. 2A to 2D are conceptual diagrams illustrating various example implementations of the storage system of FIG. 1 according to some example embodiments of the inventive concepts.

Referring to FIG. 2A, the storage system 1000 of FIG. 1 may be implemented in an electronic device 1000a (e.g., a smartphone, a tablet computer, a personal computer, a laptop computer, an Internet of Things (IoT) device, a virtual reality device, an augmented reality device, etc.). The electronic device 1000a may include an application processor 1100a and an embedded storage device 1200a. The electronic device 1000a may have a slot 1401 for mounting a removable storage device 1300a. For example, the removable storage device 1300a may be implemented in the form of a card, a stick, a chip package, etc., and may be mounted in or detached from the slot 1401.

For example, the application processor 1100a may be connected to directly communicate with the embedded storage device 1200a through a conductive pattern W1 (e.g., a conductive datapath, etc.). In the case where the removable storage device 1300a is mounted in the slot 1401, the embedded storage device 1200a may be connected to directly communicate with the removable storage device 1300a through a conductive pattern W2. In contrast, the removable storage device 1300a may not be directly connected with the application processor 1100a.

Figure 2B:
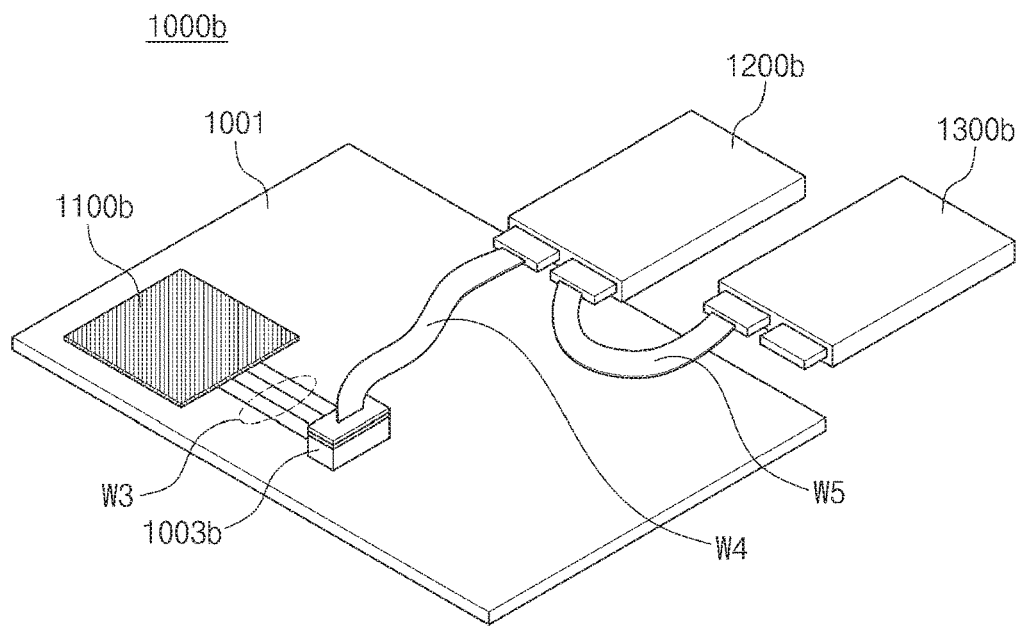
Figure 2C:
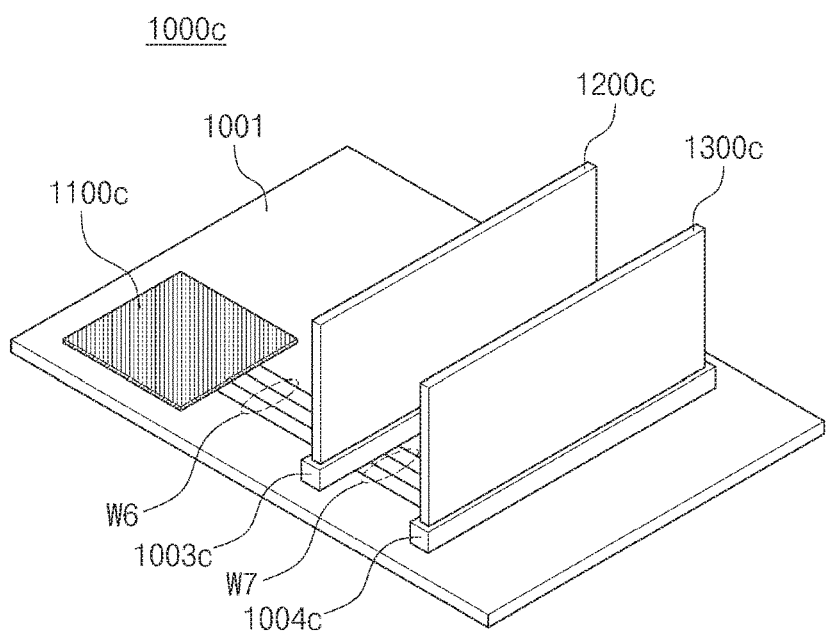
Figure 2D:
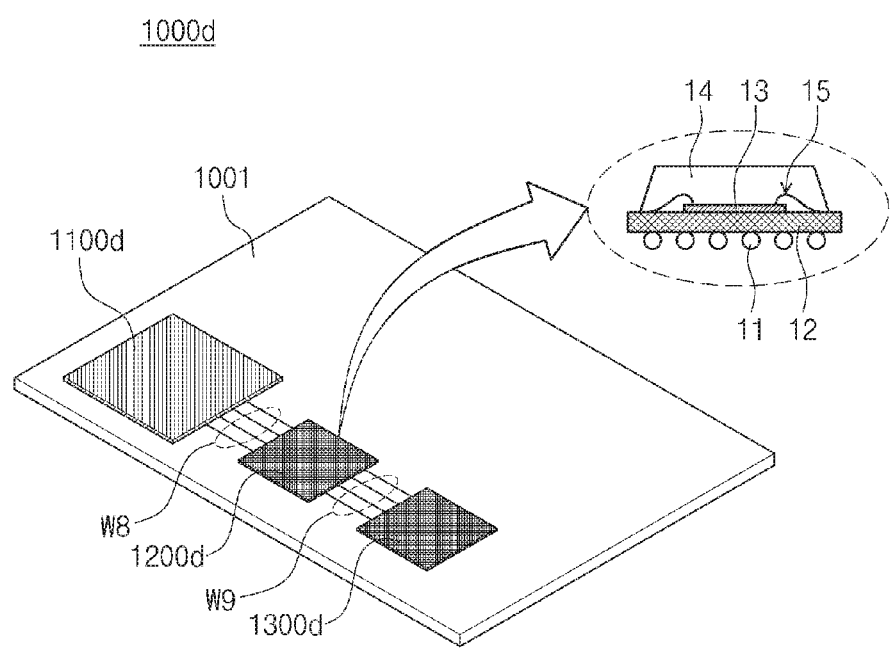

Referring to FIGS. 2B to 2D, the storage system 1000 of FIG. 1 may be implemented in a computing system 1000b, 1000c, or 1000d (e.g., a desktop computer, a laptop computer, a workstation, a server system, etc.). The computing system 1000b of FIG. 2B may include a central processing unit (CPU) 1100b and storage devices 1200b and 1300b, but is not limited thereto. The CPU 1100b may be mounted on a main board (or a mother board) 1001.

For example, each of the storage devices 1200b and 1300b may be a hard disk drive (HDD), a solid state drive (SSD), etc., that is implemented with a box module. The first storage device 1200b may be connected with a connector 1003b on the main board 1001 and may be connected to directly communicate with the CPU 1100b through a conductive pattern W3 and a wire cable W4, but is not limited thereto. The second storage device 1300b may be connected to directly communicate with the first storage device 1200b through a wire cable W5, but is not limited thereto. However, the second storage device 1300b may not be directly connected with the CPU 1100b. That is, the CPU 1100b and the storage devices 1200b and 1300b may be serially connected to each other and/or may be connected in a cascade manner, etc.

The computing system 1000c of FIG. 2C may include a CPU 1100c and storage devices 1200c and 1300c. For example, each of the storage devices 1200c and 1300c may be a memory module, a SSD, etc., that is implemented with a card module. The first storage device 1200c may be connected with a connector 1003c on the main board 1001 and may be connected to directly communicate with the CPU 1100b through a conductive pattern W6. The second storage device 1300c may be connected with a connector 1004c on the main board 1001 and may be connected to directly communicate with the first storage device 1200c through a conductive pattern W7. However, the second storage device 1300c may not be directly connected (e.g., may not directly communicate) with the CPU 1100c.

The computing system 1000d of FIG. 2D may include a CPU 1100d and storage devices 1200d and 1300d. For example, each of the storage devices 1200d and 1300d may be an on-board SSD, a ball grid array (BGA) SSD that is implemented with a chip or a chip package, etc., but is not limited thereto. The first storage device 1200d may be connected to directly communicate with the CPU 1100d through a conductive pattern W8 and may be connected to directly communicate with the second storage device 1300d through a conductive pattern W9. However, the second storage device 1300d may not be directly connected and/or directly communicate with the CPU 1100d.

For example, in the case where the first storage device 1200d is the BGA SSD, the first storage device 1200d may include a nonvolatile memory/controller chip 13 that is mounted on a substrate 12. The nonvolatile memory/controller chip 13 may be connected with the conductive patterns W8 and W9 through bonding 15 and may be covered with a mold compound 14. The first storage device 1200d may be mounted on the main board 1001 through solder balls 11.

In some example embodiments, each of the computing systems 1000b, 1000c, and 1000d may further include a working memory that temporarily stores data processed and/or data to be processed by the corresponding CPU 1100b, 1100c, or 1100d, a communication circuit for communication with an external device/system, and a user interface for exchanging data/information with a user. The working memory, the communication circuit, and the user interface may be mounted on the main board 1001 and may be connected with the corresponding CPU 1100b, 1100c, or 1100d through conductive patterns or buses.

In FIGS. 2A to 2D, each of the CPUs 1100a, 1100b, 1100c, and 1100d may correspond to the operation processor device 1100 of FIG. 1. Each of the embedded storage device 1200b and the first storage devices 1200b, 1200c, and 1200d may correspond to the first storage device 1200 of FIG. 1. Each of the removable storage device 1300a and the second storage devices 1300b, 1300c, and 1300d may correspond to the second storage device 1300 of FIG. 1. As described with reference to FIG. 1, the configurations of FIGS. 2A to 2D may improve performance, satisfy user requirements, and may also provide economic benefits.

For example, each of the conductive patterns W1, W2, W3, W6, W7, W8, and W9 may be a conductive material formed on a printed circuit board (PCB) and/or the main board 1001. For example, each of the conductive patterns W1, W2, W3, W6, W7, W8, and W9 may include a wire pattern, a trace pattern, etc. For example, the conductive material may be implemented with a wire, a trace, a conductive plate, etc. However, example embodiments of the inventive concepts may not be limited to the above-described examples.

Figure 3:
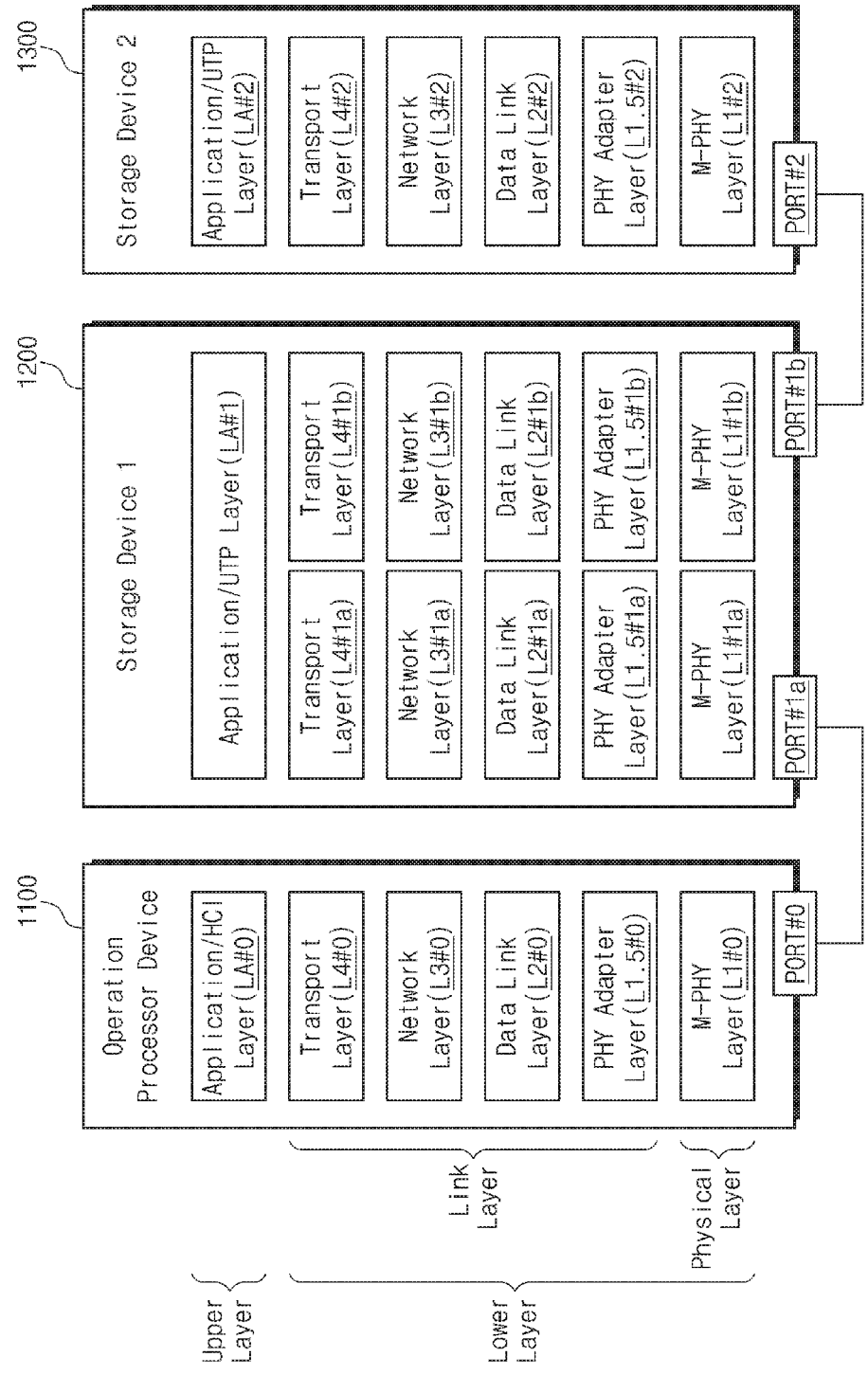
FIG. 3 is a block diagram illustrating a layer structure complying with an example interface protocol applicable to the storage system of FIG. 1 according to at least one example embodiment of the inventive concepts.

FIG. 3 is a block diagram illustrating a layer structure complying with an example interface protocol, which is applicable to the storage system 1000 of FIG. 1, according to at least one example embodiment. For example, to communicate with each other, the operation processor device 1100 and the storage devices 1200 and 1300 may be implemented according to the UFS protocol that is supported by the mobile industry processor interface (MIPI) alliance, but is not limited thereto.

In an example of FIG. 3, the operation processor device 1100 may include an M-PHY layer L1#0, a PHY adapter layer L1.5#0, a data link layer L2#0, a network layer L3#0, a transport layer L4#0, and an application/HCI (Host Controller Interface) layer LA#0 (hereinafter referred to as an "application layer"). Each of the layers L1#0, L1.5#0, L2#0, L3#0, L4#0, and LA#0 of the operation processor device 1100 may include a physical hardware circuit and/or a program code executable by at least one processor core to perform various function(s) related to an electronic device (e.g., the own functions of the electronic device).

The first storage device 1200 may include M-PHY layers L1#1a and L1#1b, PHY adapter layers L1.5#1a and L1.5#1b, data link layers L2#1a and L2#1b, network layers L3#1a and L3#1b, transport layers L4#1a and L4#1b, and an application/UTP (UFS Transport Protocol) layer LA#1 (hereinafter referred to as an "application layer"). The layers L1#1a, L1#1b, L1.5#1a, L1.5#1b, L2#1a, L2#1b, L3#1a, L3#1b, L4#1a, L4#1b, and LA#1 of the first storage device 1200 may be included in the controller 1231 of FIG. 1. Each of the layers L1#1a, L1#1b, L1.5#1a, L1.5#1b, L2#1a, L2#1b, L3#1a, L3#1b, LA#1a, L4#1b, and LA#1 of the first storage device 1200 may include a hardware circuit and/or program code executable by at least one processor core to perform various function(s) related to the electronic device.

The second storage device 1300 may include an M-PHY layer L1#2, a PHY adapter layer L1.5#2, a data link layer L2#2, a network layer L3#2, a transport layer L4#2, and an application/UTP layer LA#2. The layers L1#2, L1.5#2, L2#2, L3#2, L4#2, and LA#2 of the second storage device 1300 may be included in the controller 1331 of FIG. 1. Each of the layers L1#2, L1.5#2, L2#2, L3#2, L4#2, and LA#2 of the second storage device 1300 may include a hardware circuit and/or program code executable by at least one processor core to perform various function(s) related to the electronic device.

Each of the M-PHY layers L1#0, L1#1a, L1#1b, and L1#2 may include a communication circuit (e.g., a transmitter/receiver, a modulator/de-modulator, an encoder/decoder, and an oscillator) to send and receive a packet. The M-PHY layer L1#0 of the operation processor device 1100 may exchange a packet with the M-PHY layer L1#1a of the first storage device 1200 through ports PORT#0 and PORT#1a, and the M-PHY layer L1#1b of the first storage device 1200 may exchange a packet with the M-PHY layer L1#2 of the second storage device 1300 through ports PORT#1b and PORT#2. For example, as a physical layer, each of the M-PHY layers L1#0, L1#1a, L1#1b, and L1#2 may be implemented according to the M-PHY protocol supported by the MIPI alliance, but is not limited thereto.

The PHY adapter layers L1.5#0, L1.5#1a, L1.5#1b, and L1.5#2 may manage communication environments of the M-PHY layers L1#0, L1#1a, L1#1b, and L1#2, respectively. For example, the PHY adapter layers L1.5#0, L1.5#1a, L1.5#1b, and L1.5#2 may process data symbols or may control electric power, for the respective M-PHY layers L1#0, L1#1a, L1#1b, and L1#2. Each of the data link layers L2#0, L2#1a, L2#1b, and L2#2 may manage physical transmission and composition of data. Each of the network layers L3#0, L3#1a, L3#1b, and L3#2 may manage a communication path or may handle communication timing. Each of the transport layers L4#0, L4#1a, L4#1b, and L4#2 may detect an error of data and may recover erroneous data, but is not limited thereto.

Accordingly, the PHY adapter layers L1.5#0, L1.5#1a, L1.5#1b, and L1.5#2, the data link layers L2#0, L2#1a, L2#1b, and L2#2, the network layers L3#0, L3#1a, L3#1b, and L3#2, and the transport layers L4#0, L4#1a, L4#1b, and L4#2 may perform transmission and conversion of packets exchanged through the M-PHY layers L1#0, L1#1a, L1#1b, and L1#2. For example, the PHY adapter layers L1.5#0, L1.5#1a, L1.5#1b, and L1.5#2, the data link layers L2#0, L2#1a, L2#1b, and L2#2, the network layers L3#0, L3#1a, L3#1b, and L3#2, and the transport layers L4#0, L4#1a, L4#1b, and L4#2 may be implemented according to the UniPro protocol supported by the MIPI alliance as a link layer, but is not limited thereto.

The application layers LA#0, LA#1, and LA#2 may provide a communication service on the operation processor device 1100 and the storage devices 1200 and 1300, based on packets transferred through the link layer. The application layers LA#0, LA#1, and LA#2, which are an upper layer, may handle a request from the user of the operation processor device 1100 and the storage devices 1200 and 1300. Meanwhile, the M-PHY layers L1#0, L1#1a, L1#1b, and L1#2, the PHY adapter layers L1.5#0, L1.5#1a, L1.5#1b, and L1.5#2, the data link layers L2#0, L2#1a, L2#1b, and L2#2, the network layers L3#0, L3#1a, L3#1b, and L3#2, and the transport layers L4#0, L4#1a, L4#1b, and L4#2, which are lower layers, may communicate with an external device for the application layers LA#0, LA#1, and LA#2, but is not limited thereto.

According to at least one example embodiment, communications among layers may be based on packets having different data formats, but is not limited thereto. For example, a data format of a packet exchanged between the application layers LA#0 and LA#1 may be different from the data format of a packet exchanged between the PHY adapter layers L1.5#0 and L1.5#1a. For example, a data format of a packet exchanged between the data link layers L2#1b and L2#2 may be different from the data format of a packet exchanged between the transport layers L4#1b and L4#2. However, according to other example embodiments, the data formats between one or more application layers may be the same.

For example, according to the interface protocol supported by the MIPI alliance, each of the application layers LA#0, LA#1, and LA#2 may convey and process a packet having a UFS protocol information unit (UPIU) format. For example, each of the PHY adapter layers L1.5#0, L1.5#1a, L1.5#1b, and L1.5#2 may convey and process a packet having a data format that includes a PHY adapter control protocol (PACP) frame. Configurations of the UPIU format and PACP frame are well understood one of ordinary skill in the art, and a detailed description thereof will not be repeated here.

In some example embodiments to be described below, it may be assumed that the storage system 1000 adopts the UFS protocol. However, the assumption is provided to help with the understanding of the example embodiments, and the example embodiments of the inventive concepts are not limited thereto. According to other example embodiments of the inventive concepts, other interface protocols besides the UFS protocol may be used as well based on the following descriptions.

Figure 4:
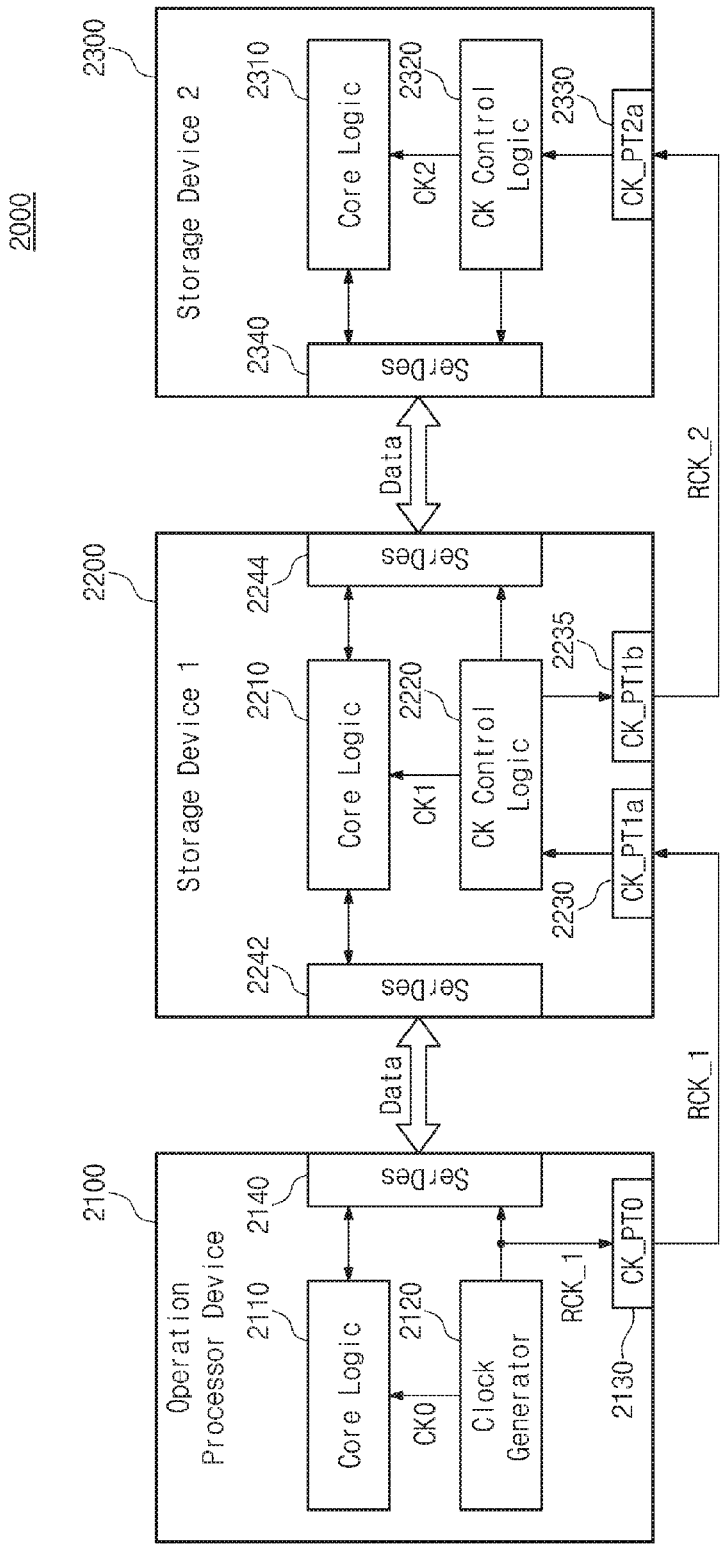
FIG. 4 is a block diagram illustrating a storage system adopting a serial interface protocol according to at least one example embodiment of the inventive concepts.

FIG. 4 is a block diagram simply illustrating a storage system 2000 adopting a serial interface protocol, according to at least one example embodiment of the inventive concepts. Referring to FIG. 4, the storage system 2000 may include an operation processor device 2100, a first storage device 2200, and a second storage device 2300, but is not limited thereto, for example, three or more storage devices and/or other serial devices may be included in the storage system 2000. According to at least one example embodiment, the storage system 2000 may transmit the reference clock RCK for serializing and/or deserializing transmission and/or reception data and/or a control signal in the cascade manner.

The operation processor device 2100 may manage and process overall operations of the storage system 2000. A general function of the operation processor device 2100 is substantially the same as that of the operation processor device 1100 described with reference to FIG. 1. Accordingly, a control function of the operation processor device 2100 is omitted. However, according to at least one example embodiment of the inventive concepts, the operation processor device 2100 may generate a reference clock RCK_1. Data may be serialized and deserialized by a serializer/deserializer circuit 2140 based on the reference clock RCK_1. In addition, the operation processor device 2100 may transmit the generated reference clock RCK_1 through a separately provided clock port (CK_PT0) 2130 to share the reference clock RCK_1 with the first storage device 2200, but is not limited thereto. To this end, the operation processor device 2100 may include core logic 2100, a clock generator 2120, and the serializer/deserializer 2140.

For data transmission using a high-speed serial interface, the clock generator 2120 may generate the reference clock RCK_1 by using an oscillator having high accuracy. The clock generator 2120 may generate a clock signal of various target frequencies by using the generated reference clock RCK_1, the phase locked loop PLL, etc. A generated clock signal CK0 may be provided to the core logic 2110 in the operation processor device 2100. Here, the core logic 2100 may include various circuits, function blocks, and/or intellectual property blocks (IPs) in the operation processor device 2100 related to various processing functions. That is, the core logic 2110 may include all of the function (e.g., function blocks, IPs, circuits) for generating, storing, and processing data, or in other words, other functions besides generating the reference clock.

Data that is generated and/or processed by the core logic 2110 may be transmitted to the first storage device 2200 and/or the second storage device 2300. In this case, transmission data may be converted into serial data by the serializer/deserializer circuit 2140. For high-speed serial transmission, the serializer/deserializer circuit 2140 may serialize transmission data to a form suitable for high-speed transmission by using the reference clock RCK_1.

In addition, the reference clock RCK_1 generated by the clock generator 2120 may be transmitted to the first storage device 2200 through the clock port 2130. The clock port 2130 may be a unique clock output port of the operation processor device 2100, which is used to output the reference clock RCK_1. That is, according to at least one example embodiment, the operation processor device 2100 may not transmit the reference clock RCK_1 to any other ports except for a clock input port (CK_PT1a) 2230 of the first storage device 2200 (e.g., through a dedicated clock port), but is not limited thereto.

The first storage device 2200 performs high-speed serial data transmission between the operation processor device 2100 and the second storage device 2300 by using the reference clock RCK_1 provided by the operation processor device 2100. In addition, the first storage device 2200 may bypass the reference clock RCK_1 from the operation processor device 2100 to the second storage device 2300, or may transmit the reference clock RCK_1 to the second storage device 2300 after tuning. Here, a reference clock RCK_2 transmitted to the second storage device 2300 may have the same clock parameter(s) as that of the reference clock RCK_1 (e.g., frequency, amplitude, duty ratio, slew rate, etc.). Alternatively, the reference clock RCK_2 may be a clock signal of which the amplitude, duty ratio, and/or slew rate is adjusted by amplifying and/or tuning the reference clock RCK_1.

The first storage device 2200 may include core logic 2210, clock control logic 2220, clock ports 2230 and 2235, and serializer/deserializers circuits 2242 and 2244, etc. Here, the core logic 2210 may include all functions and/or function blocks for processing, storing, and converting data sent and received to and from the first storage device 2200. The core logic 2210 includes all functions and/or function blocks for processing data, commands, and control signals shortly before they are transmitted to the serializer/deserializer circuit 2242 and 2244. For example, the core logic 2210 may include a memory block, a storage controller, etc. The clock control logic 2220 may generate a clock signal CK1 by using the reference clock RCK_1 provided from the operation processor device 2100. The clock control logic 2220 may transmit the reference clock RCK_1 to the serializer/deserializers circuits 2242 and 2244 and/or may transmit the reference clock RCK_1 to the clock port 2235 for a transfer to the second storage device 2300.

The second storage device 2300 may exchange data with the first storage device 2200 by using the reference clock RCK_2 provided from the first storage device 2200. The second storage device 2300 may include core logic 2310, clock control logic 2320, a clock port 2330, and a serializer/deserializer circuit 2340. Here, the core logic 2310 may include all functions and/or function blocks for processing, storing, and converting data exchanged with the first storage device 2200. The clock control logic 2320 may generate a clock signal CK2 by using the reference clock RCK_2 provided from the first storage device 2200. The clock control logic 2320 may transmit the reference clock RCK_2 to the serializer/deserializer circuit 2340.

In the above-described structure of the storage system 2000, a path, in which the reference clock RCK_1 is directly transmitted to the second storage device 2300 without passing through the first storage device 2200, is absent. That is, a reference clock is transmitted to the storage devices 2200 and 2300 in a cascade and/or serial manner.

Figure 5:
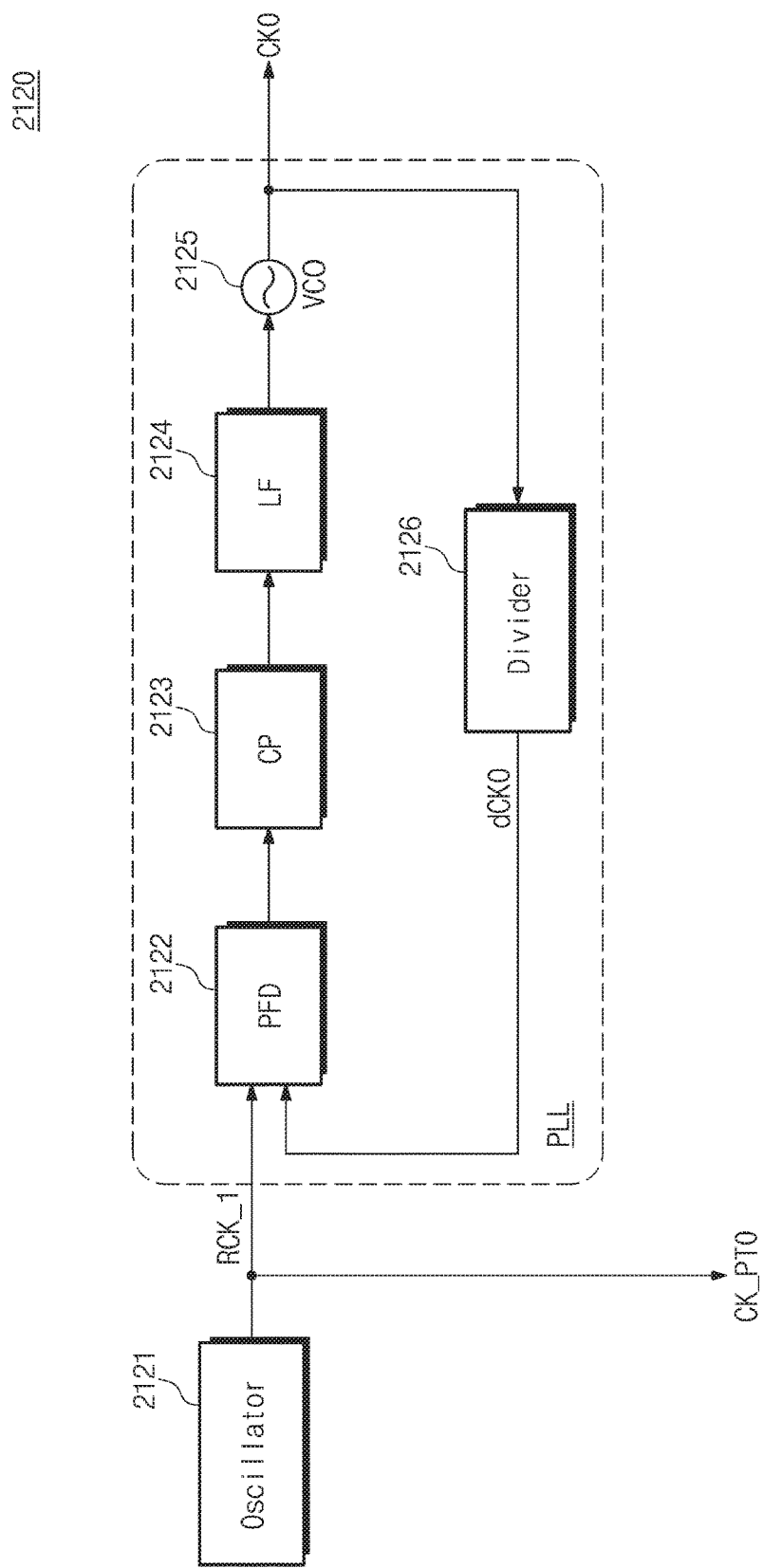
FIG. 5 is a block diagram illustrating a structure of a clock generator included in an operation processor device of FIG. 4 according to at least one example embodiment of the inventive concepts.

FIG. 5 is a block diagram illustrating a structure of the clock generator 2120 included in the operation processor device 2100 of FIG. 4 according to at least one example embodiment. Referring to FIG. 5, the clock generator 2120 of the operation processor device 2100 may include an oscillator 2121 that generates the reference clock RCK_1 and the phase locked loop PLL, etc.

The oscillator 2121 generates the reference clock RCK_1. The oscillator 2121 may generate an oscillation signal with a stable frequency in various environments. To this end, the oscillator 2121 may be implemented with the temperature compensated crystal oscillator TCXO. However, the oscillator 2121 may not be limited to this disclosure. For example, the oscillator 2121 may be implemented with at least one of a voltage controlled temperature compensated crystal oscillator (VC-TCXO), a digital TCXO (DTCXO), a phase locked loop crystal oscillator (PLXO), a simple package crystal oscillator (SPXO), and a voltage controlled crystal oscillator (VCXO), etc.

The phase locked loop PLL generates the output clock CK0 with a fixed frequency by using the reference clock RCK_1 and a divided output clock dCK0. The phase locked loop PLL may include a phase frequency detector 2122, a charge pump 2123, a loop filter 2124, a voltage controlled oscillator 2125, and a divider 2126, etc.

The phase frequency detector 2122 detects a phase error between the reference clock RCK_1 and a signal fed back through the divider 2126. The phase frequency detector 2122 may compare phases of the reference clock RCK_1 and the divided output clock dCK0 to output a signal corresponding to a phase error (and/or a frequency difference) between the two signals RCK_1 and the dCK0. For example, the phase frequency detector 2122 may also output a pulse that has a width corresponding to the phase error between the two signals RCK_1 and the dCK0.

The charge pump 2123 generates a voltage by using an output pulse of the phase frequency detector 2122. For example, the charge pump 2123 may adjust the amount of charges to be supplied to an output node of the charge pump based on a width of the output pulse of the phase frequency detector 2122. Accordingly, a voltage level of the output node is determined by adjusting the current to be supplied to the output node. The loop filter 2124 may remove a high-frequency component from a voltage signal output from the charge pump 2123. That is, the loop filter 2124 may correspond to a low pass filter according to at least one example embodiment, but is not limited thereto. The voltage controlled oscillator 2125 may output a signal of a frequency that is determined according to a level of an input signal. An output of the voltage controlled oscillator 2125 may be used as a clock signal having a stabilized phase (and/or frequency).

The divider 2126 may be an element for feeding back an output signal of the voltage controlled oscillator 2125 to the phase frequency detector 2122. Since a frequency of the output signal of the voltage controlled oscillator 2125 is very high in comparison to the reference clock signal, it is difficult to compare the output signal with the reference clock RCK_1. Accordingly, the divider 2126 may divide the frequency of the output clock CK0 at an appropriate ratio (e.g., a desired ratio) to allow the output clock CK0 to be easily compared with the reference clock RCK_1.

The clock generator 2120 included in the operation processor device 2100 may generate the reference clock RCK_1. The clock CK0 for an internal operation of the operation processor device 2100 may be generated by using the generated reference clock RCK_1 as a source. In addition, the reference clock RCK_1 generated by the clock generator 2120 may be transmitted to the first storage device 2200 in the cascade manner.

Figure 6A:
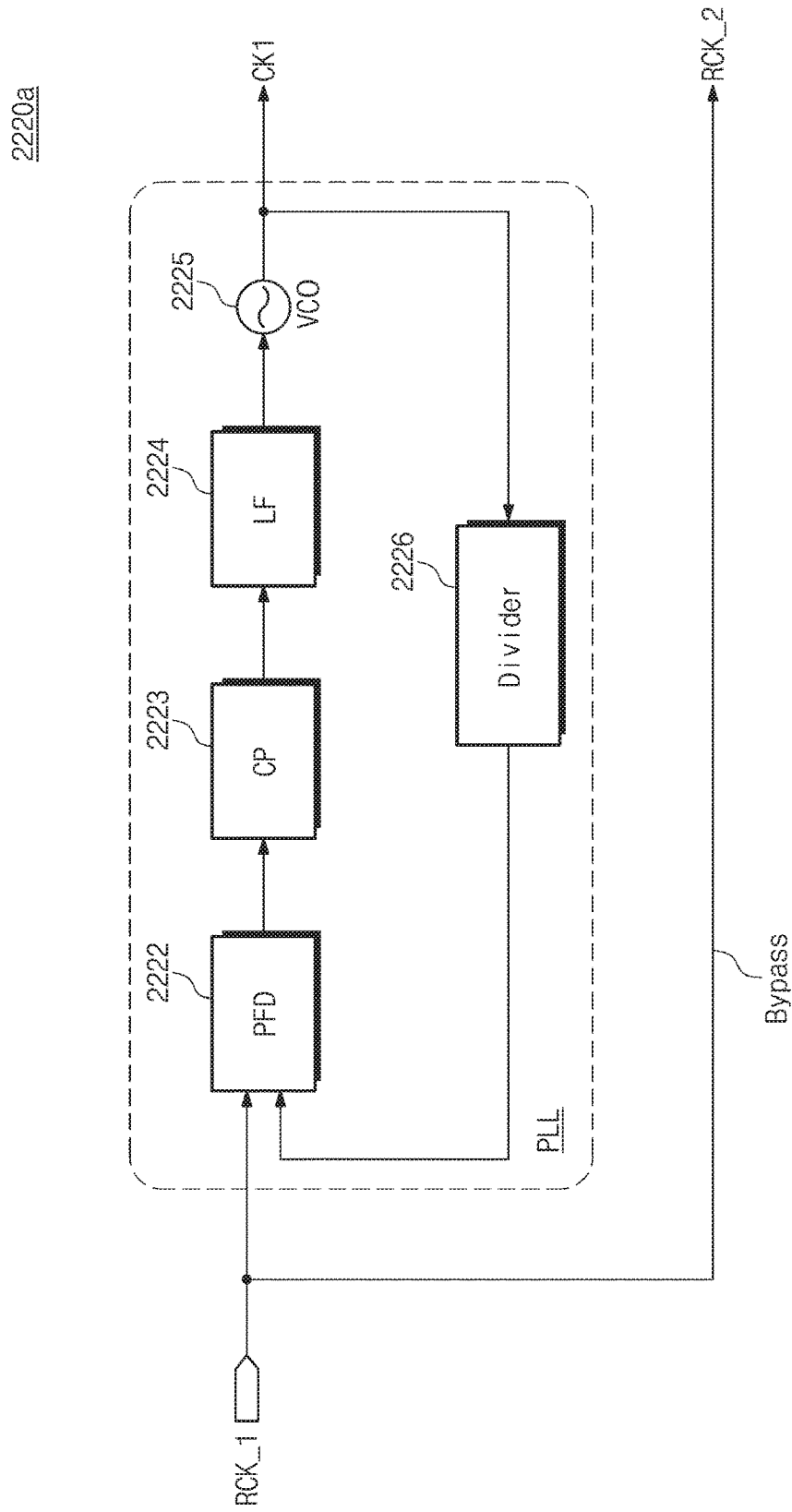
FIGS. 6A and 6B are block diagrams illustrating configurations of the clock control circuit included in a first storage device of FIG. 4 according to at least one example embodiment of the inventive concepts.
Figure 6B:
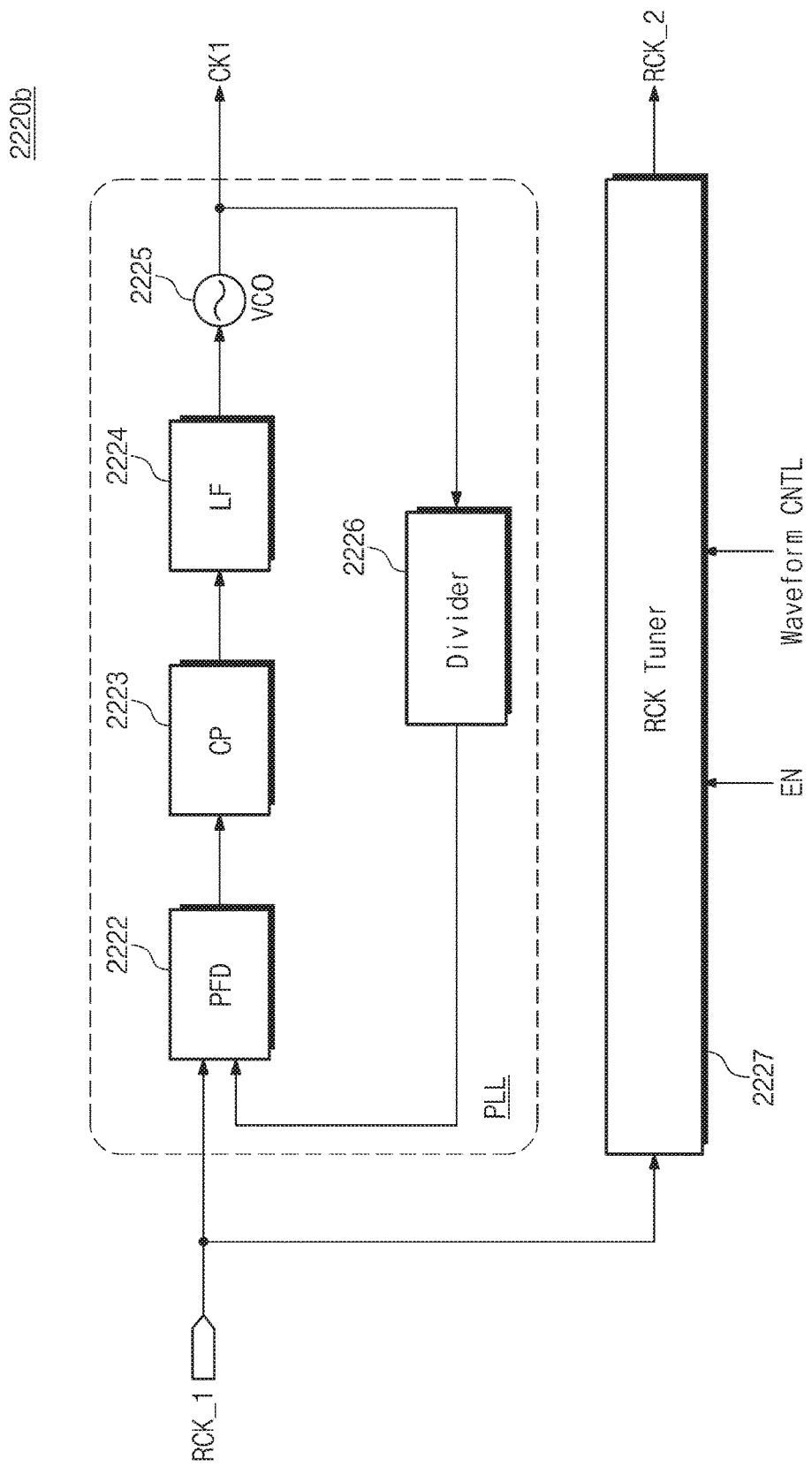

FIGS. 6A and 6B are block diagrams illustrating configurations of the clock control circuit 2220 included in the first storage device 2200 of FIG. 4 according to some example embodiments. FIG. 6A shows a clock control circuit 2220a that bypasses the reference clock RCK_1 to the second storage device 2300 (e.g., passes the reference clock directly to the second storage device 2300 without going through a first storage device). FIG. 6B shows a clock control circuit 2220b that transmits the reference clock RCK_1 to the second storage device 2300 after tuning the reference clock RCK_1.

Referring to FIG. 6A, according to at least one example embodiment of the inventive concepts, the clock control circuit 2220a may generate the internal clock CK1 through the phase locked loop PLL based on the reference clock RCK_1. A process of generating the internal clock CK1 by using the phase locked loop PLL is similar to that described with reference to FIG. 5, and a description thereof is thus omitted. In addition, the clock control circuit 2220a may transmit the reference clock RCK_1 to the clock port 2235 to transmit the reference clock RCK_1 to the second storage device 2300 without any separate processing according to at least one example embodiment. Additionally, the clock control circuit 2200a may bypass the reference clock RCK_1 provided by the operation processor device 2100 to the second storage device 2300, or in other words, the reference clock RCK_1 may be directly transmitted to the second storage device 2300 as the reference clock RCK_2 from the operation processor device 2100 without going through the PLL circuit of the clock control circuit 2200a. According to some example embodiments, delay control circuits (not illustrated) may be further included to bypass the reference clock RCK_1 to the second storage device 2300, but is not limited thereto.

Referring to FIG. 6B, according to another example embodiment, the clock control circuit 2220b may generate the internal clock CK1 based on the reference clock RCK_1 by using the phase locked loop PLL. In particular, the clock control circuit 2220b may include a reference clock tuner 2227 that tunes the reference clock RCK_1, or in other words, the reference clock tuner 2227 may adjust the reference clock signal based on one or more desired clock parameters. The reference clock tuner 2227 may adjust parameters of the reference clock RCK_1, such as a voltage level, a frequency, an amplitude, a slew rate, a duty ratio, a driving strength, etc., to be suitable for desired requirements of the second storage device 2300. That is, the reference clock tuner 2227 may generate the reference clock RCK_2 by tuning the reference clock RCK_1 with reference to a waveform control signal Waveform CNTL based on various desired parameters, such as the desired parameters of the second storage device 2300. In addition, the reference clock tuner 2227 may reduce and/or prevent the reference clock RCK_1 from being transmitted to the second storage device 2300 in response to (and/or based on) an enable signal EN.

Figure 7:
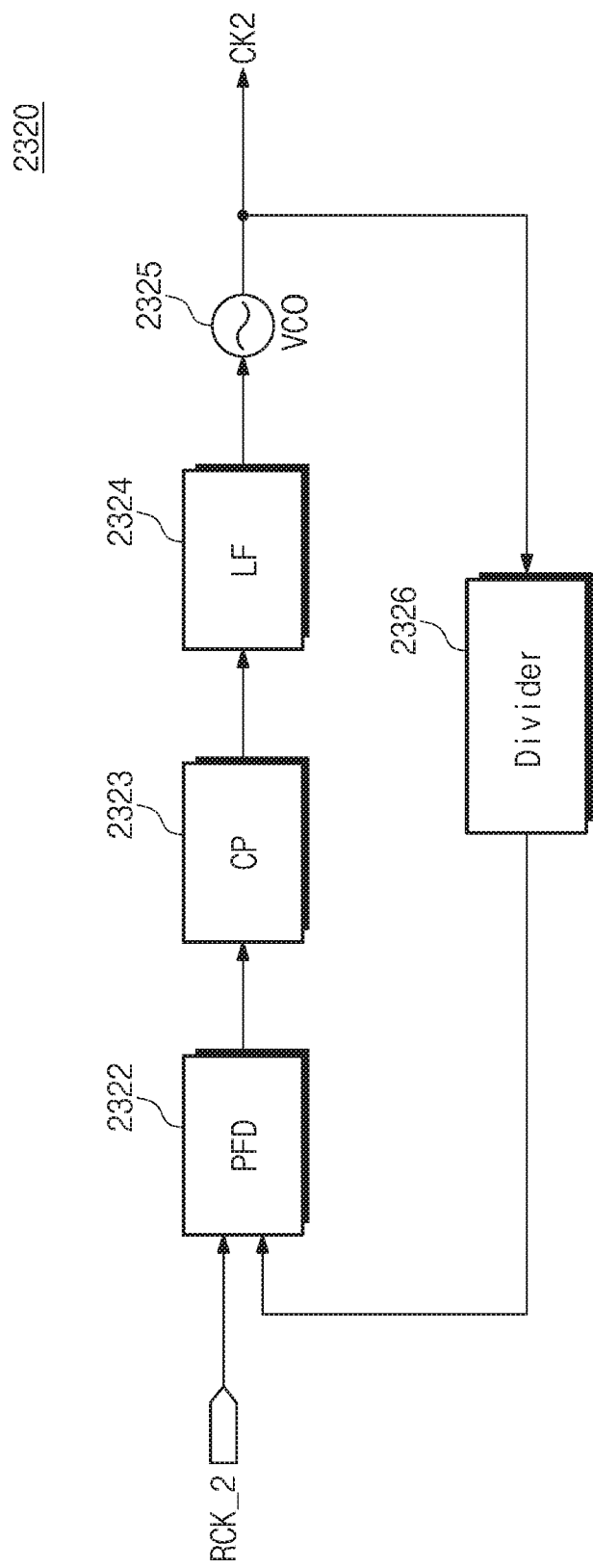
FIG. 7 is a block diagram illustrating the clock control circuit included in a second storage device according to at least one example embodiment of the inventive concepts.

FIG. 7 is a block diagram illustrating the clock control circuit 2320 included in the second storage device 2300 according to at least one example embodiment. Referring to FIG. 7, the clock control circuit 2320 of the second storage device 2300 may generate the internal signal CK2 by using (and/or based on) the reference clock RCK_2. The clock control circuit 2320 may be implemented with the phase locked loop PLL. That is, the clock control circuit 2320 may include a phase frequency detector 2322, a charge pump 2323, a loop filter 2324, a voltage controlled oscillator 2325, and a divider 2326, etc., but is not limited thereto. An operation of the phase locked loop PLL may be similar to the PLL of FIG. 5, and therefore a description is omitted.

Figure 8:
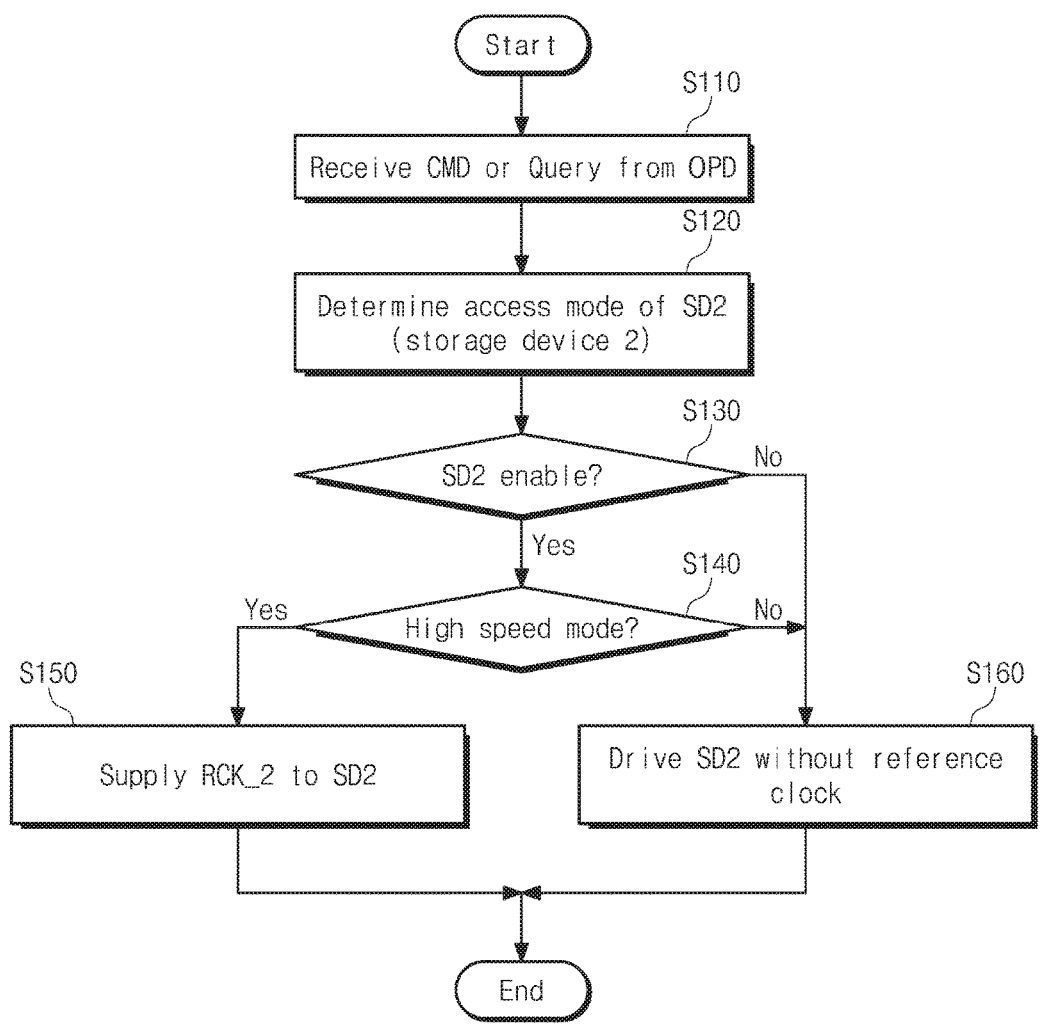
FIG. 8 is a flowchart illustrating how a reference clock is processed in the first storage device of the storage system of FIG. 4 according to at least one example embodiment of the inventive concepts.

FIG. 8 is a flowchart illustrating how the reference clock RCK_1 is processed in the first storage device 2200 of the storage system 2000 of FIG. 4 according to at least one example embodiment. Referring to FIG. 8, on the basis of an access mode of the second storage device 2300, the first storage device 2200 may transmit the reference clock RCK_1 to the second storage device 2300 and/or may block a transfer of the reference clock RCK_1 to the second storage device 2300.

In operation S110, the first storage device 2200 receives a command CMD and/or a query from the operation processor device 2100. Here, it is assumed that the reference clock RCK_1 is also provided by the operation processor device 2100 to the first storage device 2200, but the example embodiments are not limited thereto.

In operation S120, the first storage device 2200 may determine the access mode of the second storage device 2300 with reference to the command CMD and/or the query received from the operation processor device 2100. For example, the first storage device 2200 may decode the command CMD and/or the query and may determine whether an access of the operation processor device 2100 to the second storage device 2300 is present and/or the access mode based on the decoding result.

In operation S130, whether an access to the second storage device 2300 is present may be determined. That is, the first storage device 2200 may determine whether the operation processor device 2100 writes data in the second storage device 2300 and/or requests data stored in the second storage device 2300. If the operation processor device 2100 requests an access to the second storage device 2300 (i.e., Yes), the process proceeds to operation S140. If a request for the access to the second storage device 2300 is absent (i.e., No), the process proceeds to operation S160.

In operation S140, the first storage device 2200 may determine whether a mode to access the second storage device 2300 is a high-speed mode. If the mode to access the second storage device 2300 is the high-speed mode (i.e., Yes), the process proceeds to operation S150. If the mode to access the second storage device 2300 is not the high-speed mode (i.e., No), the process proceeds to operation S160.

In operation S150, the first storage device 2200 may bypass the reference clock RCK_1 provided by the operation processor device 2100 to the second storage device 2300 and/or may transmit the reference clock RCK_2, which is generated by tuning the reference clock RCK_1, to the second storage device 2300 according to at least one example embodiment. Here, the reference clock RCK_2 may be the same clock as the reference clock RCK_1. Additionally, the reference clock RCK_2 may be a delayed version of the reference clock RCK_1. Further, the reference clock RCK_2 may be a clock signal that is generated by tuning a waveform of the reference clock RCK_1 (e.g., by using a waveform control signal, etc.).

In operation S160, the first storage device 2200 accesses the second storage device 2300 based on a low-speed mode. For example, the first storage device 2200 accesses the second storage device 2300 without transmitting the reference clock RCK_1. In this case, the clock ports 2235 and 2330 of the first and second storage devices 2200 and 2300 may be inactivated (e.g., powered off).

Figure 9:
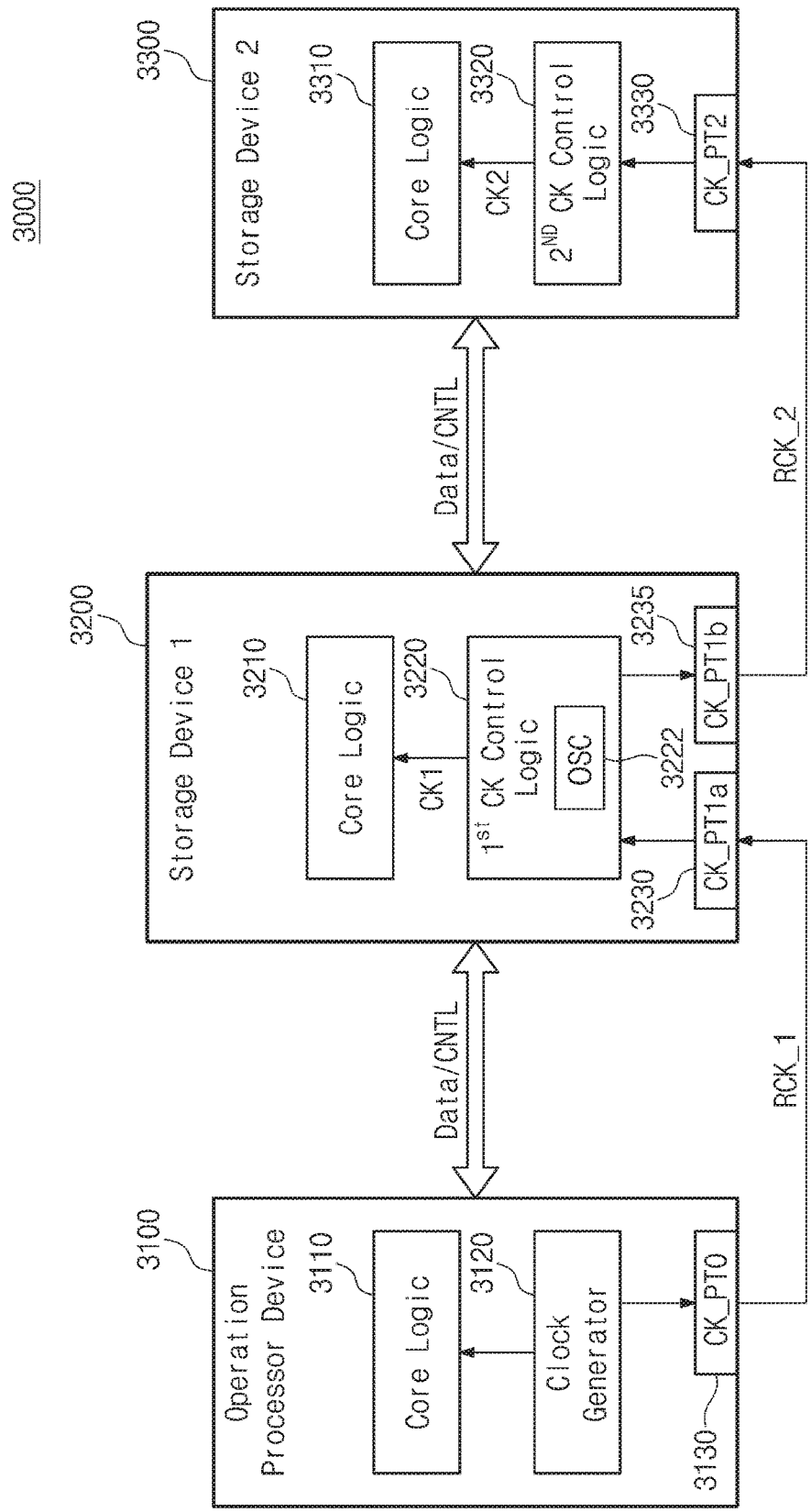
FIG. 9 is a block diagram illustrating a storage system, according to another example embodiment of the inventive concepts.

FIG. 9 is a block diagram illustrating a storage system 3000, according to at least one other example embodiment of the inventive concepts. Referring to FIG. 9, the storage system 3000 may include an operation processor device 3100, a first storage device 3200, and a second storage device 3300, etc. According to at least one example embodiment of the inventive concepts, the first storage device 3200 may generate the reference clock RCK_2 that is independent of the reference clock RCK_1 provided by the operation processor device 3100, and may transmit the reference clock RCK_2 to the second storage device 3300.

The operation processor device 3100 may generate the reference clock RCK_1 and may supply the reference clock RCK_1 to the first storage device 3200 and the second storage device 3300 in a cascade manner. The operation processor device 3100 may include a clock port (e.g., CK_PT0) 3130 for supplying the generated reference clock RCK_1 to the first storage device 3200. The operation processor device 3100 may include core logic 3110, a clock generator 3120, and the clock port 3130, etc., but is not limited thereto. Data transmission between the operation processor device 3100 and the first and/or second storage devices 3200 and 3300 is not limited to a serial interfacing manner. Configurations of the core logic 3110, the clock generator 3120, and the clock port 3130 may be similar to those described with reference to FIG. 4, and descriptions thereof is thus omitted. The operation processor device 3100 may selectively provide the reference clock RCK_1 to the first storage device 3200 based on an access mode. For example, in the low-speed mode, the operation processor device 3100 does not provide the reference clock RCK_1 to the first storage device 3200, and conversely, in a high-speed mode, the operation processor device 3100 provides the reference clock RCK_1 to the first storage device 3200, but the example embodiments are not limited thereto.

The first storage device 3200 may exchange data with the operation processor device 3100 and the second storage device 3300 by using the reference clock RCK_1 provided by the operation processor device 3100. In addition, the first storage device 3200 may perform high-speed serial data transmission with the second storage device 3300 even if the reference clock RCK_1 is not provided by the operation processor device 3100. The first storage device 3200 may include an oscillator 3222, or other component, that generates the reference clock RCK_2. Accordingly, the first storage device 3200 may exchange data with the operation processor device 3100 in the low-speed mode and/or a pulse width modulation (PWM) signal manner, and may exchange data with the second storage device 3300 in a high-speed serial interfacing manner.

To this end, the first storage device 3200 may include core logic 3210, clock control logic 3220, and clock ports 3230 and 3235, etc. Here, the core logic 3210 may include all functions and/or function blocks for processing, storing, and/or converting data of the first storage device 3200. The core logic 3210 may also include all functions and/or function blocks for processing data, commands, and/or control signals. Additionally, the core logic 3210 may include a memory block, a storage controller, or the like.

The clock control logic 3220 may generate the clock signal CK1 by using the reference clock RCK_1 transmitted from the operation processor device 3100. The clock control logic 3220 may generate a clock signal for use in data exchanges with the operation processor device 3100 and/or the second storage device 3300 by using the reference clock RCK_1. However, in the event that the reference clock RCK_1 is not received from the operation processor device 3100, the first storage device 3200 may continue to exchange data with the second storage device 3300 in the high-speed serial interfacing manner. In this case, the clock control logic 3220 may generate a reference clock signal for use in data exchanges with the second storage device 3300 by using the reference clock RCK_2 that is generated by the oscillator 3222 included therein. In addition, the first storage device 3200 may provide the generated reference clock RCK_2 to the second storage device 3300 through the clock port 3235, but is not limited thereto.

The second storage device 3300 may exchange data with the first storage device 3200 by using the reference clock RCK_2 transmitted from the first storage device 3200 in a high-speed serial interfacing manner. The second storage device 3300 may include core logic 3310, clock control logic 3320, and a clock port 3330, etc. Here, the core logic 3310 may include all functions and/or function blocks for processing, storing, and/or converting data exchanged with the first storage device 3200. The clock control logic 3320 may generate the clock signal CK2 by using (and/or based on) the reference clock RCK_2 transmitted from the first storage device 3200. The clock control logic 3320 may use the reference clock RCK_2 to perform serialization/deserialization for data exchange with the first storage device 3200, but is not limited thereto.

In the above-described structure of the storage system 3000, even though the reference clock RCK_1 is not transmitted from the operation processor device 3100 to the first storage device 3200, the first storage device 3200 may exchange serial data with the second storage device 3300 at high speed. That is, the first storage device 3200 may automatically generate the reference clock RCK_2 for high-speed data exchange with the second storage device 3300 independent of the operation processor device 3100, for example, even when a reference clock signal is not received by the first storage device 3200 from the operation processor device 3100. Although not illustrated in FIG. 9, it may be understood that the reference clock RCK_2 is provided to any other storage devices coupled with the second storage device 3300 in the cascade manner and that data may be exchanged between the storage devices using the reference clock RCK_2.

Figure 10:
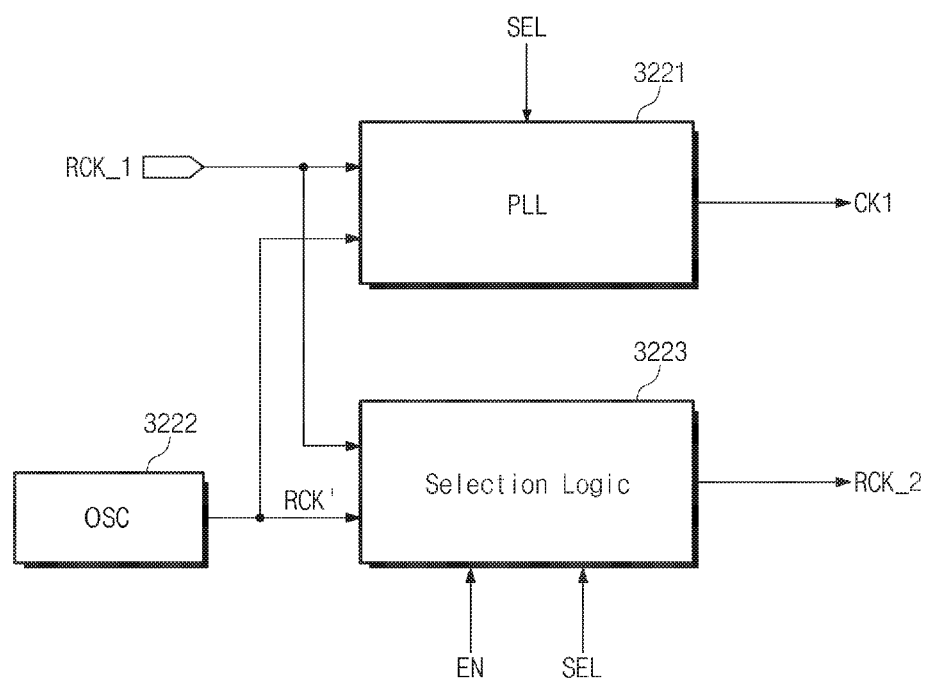
FIG. 10 is a block diagram illustrating a configuration of clock control logic included in a first storage device of FIG. 9 according to at least one example embodiment of the inventive concepts.

FIG. 10 is a block diagram illustrating a configuration of the clock control logic 3220 included in the first storage device 3200 of FIG. 9 according to at least one example embodiment. Referring to FIG. 10, the clock control logic 3220 may include a phase locked loop 3221, the oscillator 3222, and selection logic 3223, etc., but is not limited thereto.

The phase locked loop (PLL) 3221 generates the clock signal CK1 that is used in the core logic 3210 of the first storage device 3200. The phase locked loop 3221 may generate the clock signal CK1 using any one of the reference clock RCK_1 provided by the operation processor device 3100 and the reference clock RCK' generated by the oscillator 3222 itself. In a mode of operation in which the reference clock RCK_1 is transmitted from the operation processor device 3100, the phase locked loop 3221 may generate the clock signal CK1 by using the reference clock RCK_1. In this case, the phase locked loop 3221 may select any one of the reference clock RCK_1 and the reference clock RCK' in response to a selection signal SEL indicating the mode of operation.

The oscillator 3222 generates the reference clock RCK'. The oscillator 3222 may be an element for providing the clock signal CK1 and the reference clock RCK_2 that is provided to the second storage device 3330 in a mode of operation when the reference clock RCK_1 is not provided by the operation processor device 3100. The oscillator 3222 may include the temperature compensated crystal oscillator TCXO, or other component, to generate the reference clock RCK' with high accuracy. However, it may be understood that the oscillator 3222 is not limited to this disclosure.

The selection logic 3223 may select any one of the reference clock RCK_1 and the reference clock RCK' and may provide the selected clock as the reference clock RCK_2 to be transmitted to the second storage device 3300. The selection logic 3223 may select the reference clock RCK_1 or the reference clock RCK' in response to the selection signal SEL that is determined according to a mode to access the second storage device 3300 according to at least one example embodiment. The selection logic 3223 may select the reference clock RCK' when data exchange between the operation processor device 3100 and the first storage device 3200 is made in the low-speed mode and/or the data exchange between the first storage device 3200 and the second storage device 3300 is made in the high-speed mode according to at least one example embodiment. Additionally, the selection logic 3223 may also receive an enable signal EN which may control whether the reference clock RCK_2 is transmitted to the second storage device 3300. For example, if data transmission between the first storage device 3200 and the second storage device 3300 does not occur and/or is blocked, the enable signal EN may indicate that transmission of the RCK_2 signal is to be blocked by the selection logic 3223.

A configuration of the clock control logic 3220 included in the first storage device 3200 is described with reference to FIG. 10 according to at least one example embodiment. Under the control of the clock control logic 3220, the first storage device 3200 may perform high-speed serial data transmission with the second storage device 3300 even though the reference clock RCK_1 is not transmitted from the operation processor device 3100.

Figure 11:
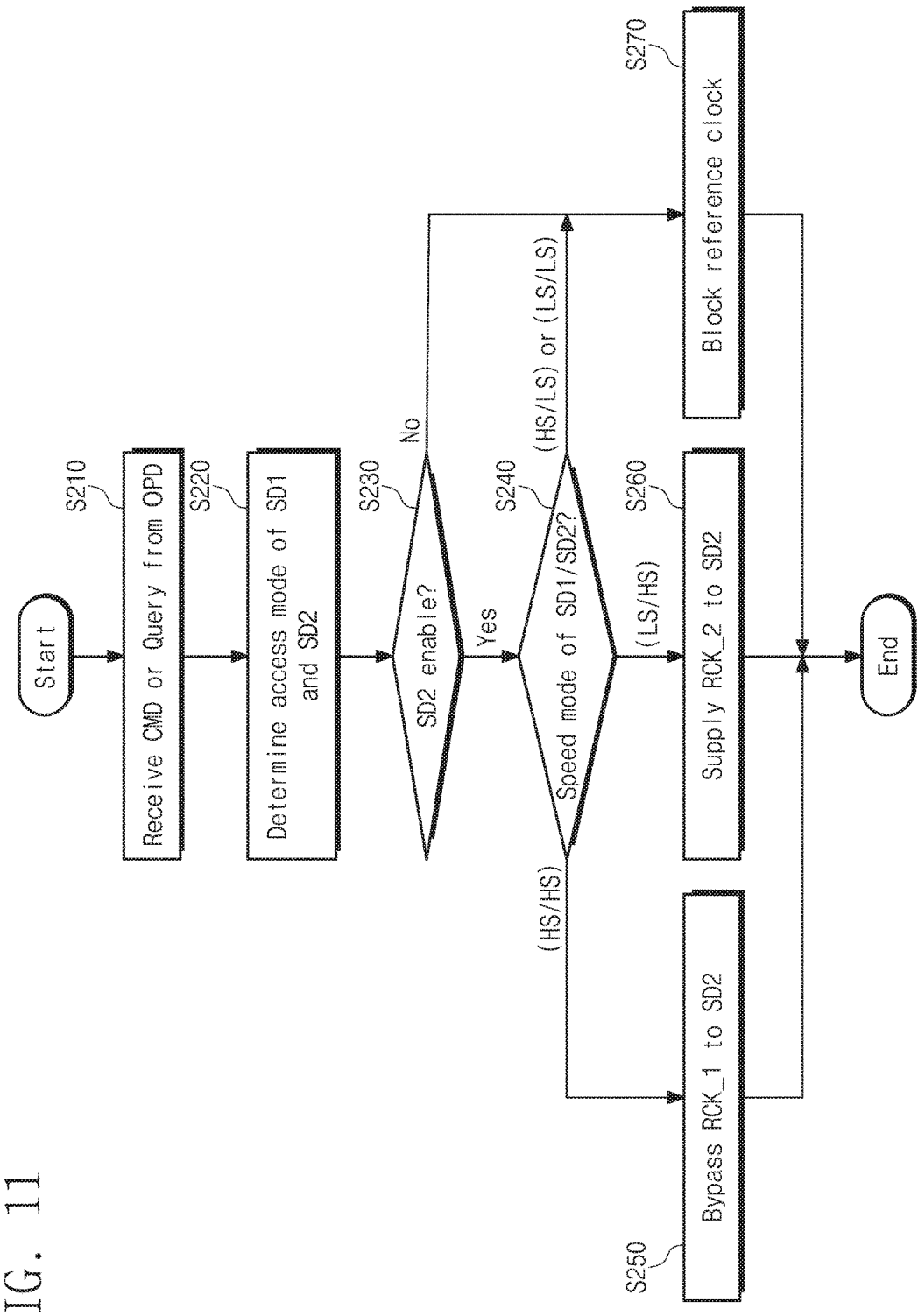
FIG. 11 is a flowchart illustrating how a reference clock is processed in the first storage device of FIG. 9 according to at least one example embodiment of the inventive concepts.

FIG. 11 is a flowchart illustrating how a reference clock is processed in the first storage device 3200 of FIG. 9 according to at least one example embodiment. Referring to FIG. 11, the first storage device 3200 may generate the reference clock RCK_2 for supporting a high-speed data exchange with the second storage device 3300 without the reference clock RCK_1 transmitted from the operation processor device 3100. Since the first storage device 3200 generates the reference clock RCK_2, the first storage device 3200 may perform high-speed serial data transmission with the second storage device 3300 regardless of whether the reference clock RCK_1 is provided by the operation processor device 3100.

In operation S210, the first storage device 3200 receives a command CMD and/or a query from the operation processor device 3100. The operation processor device 3100 may communicate with the first storage device 3200 in a high-speed serial transmission manner in which the reference clock RCK_1 is used. For example, the access mode is referred to as a "high-speed mode HS", but is not limited thereto. The operation processor device 3100 may communicate with the first storage device 3200 in a low-speed mode LS in which the reference clock RCK_1 is not used. For example, the operation processor device 3100 may transmit data to the first storage device 3200 using a PWM protocol without transmitting the reference clock RCK_1 to the first storage device 3200. In addition, an access mode between the first storage device 3200 and the second storage device 3300 includes the high-speed mode HS in which the reference clock RCK_1 or RCK_2 is used and a low-speed mode in which the reference clock RCK_1 or RCK_2 is not used.

In operation S220, the first storage device 3200 may determine the access mode based on whether the command CMD, the query, and/or the reference clock RCK_1 is received from the operation processor device 3100. That is, a first access mode between the operation processor device 3100 and the first storage device 3200, and a second access mode between the first storage device 3200 and the second storage device 3300 may be determined by the first storage device 3200 based on the received inputs.

In operation S230, the first storage device 3200 may determine whether a request for accessing the second storage device 3300 is present. If a request for the access to the second storage device 3300 is absent from the data transmission from the operation processor device 3100, the process proceeds to operation S270. If a request for the access to the second storage device 3300 is present, the process proceeds to operation S240.

In operation S240, the first storage device 3200 performs an operation branch based on the first access mode between the operation processor device 3100 and the first storage device 3200, and the second access mode between the first storage device 3200 and the second storage device 3300. If each of the first and second access modes are high-speed mode HS, the process proceeds to operation S250. If the first access mode is the low-speed mode LS (e.g., the access mode between the operation processor device 3100 and the first storage device 3200) and the second access mode (e.g., the access mode between the first storage device 3200 and the second storage device 3300) is the high-speed mode HS, the process proceeds to operation S260. If the second access mode is the low-speed mode regardless of the access mode setting of the first access mode (e.g., HS/LS or LS/LS), the process proceeds to operation S270.

In operation S250, the first storage device 3200 may transmit the reference clock RCK_1 provided by the operation processor device 3100 to the second storage device 3300. In this case, the first storage device 3200 may bypass the reference clock RCK_1 to the second storage device 3300 and/or transmits the reference clock RCK_1 after tuning.

In operation S260, the first storage device 3200 provides the reference clock RCK_2 for high-speed data transmission to the second storage device 3300. The reference clock RCK_2 is a clock signal that is generated by the first storage device 3200, e.g., generated by the oscillator 3222 included in the first storage device 3200.

In operation S270, the first storage device 3200 may block the reference clock RCK_2 from being transmitted to the second storage device 3300. Accordingly, data exchange between the first storage device 3200 and the second storage device 3300 may be blocked, and/or the data exchange may be made using the low-speed mode LS, such as data exchange using the PWM protocol or other low-speed data transfer protocol.

A method of transmitting a reference clock based on an access mode between the operation processor device 3100 and the first storage device 3200 and an access mode between the first storage device 3200 and the second storage device 3300 is described with reference to FIG. 11 according to at least one example embodiment. According to the above-described method, a reference clock having high reliability and efficiency may be provided in the storage system 3000 to which the cascade manner is applied.

Figure 12:
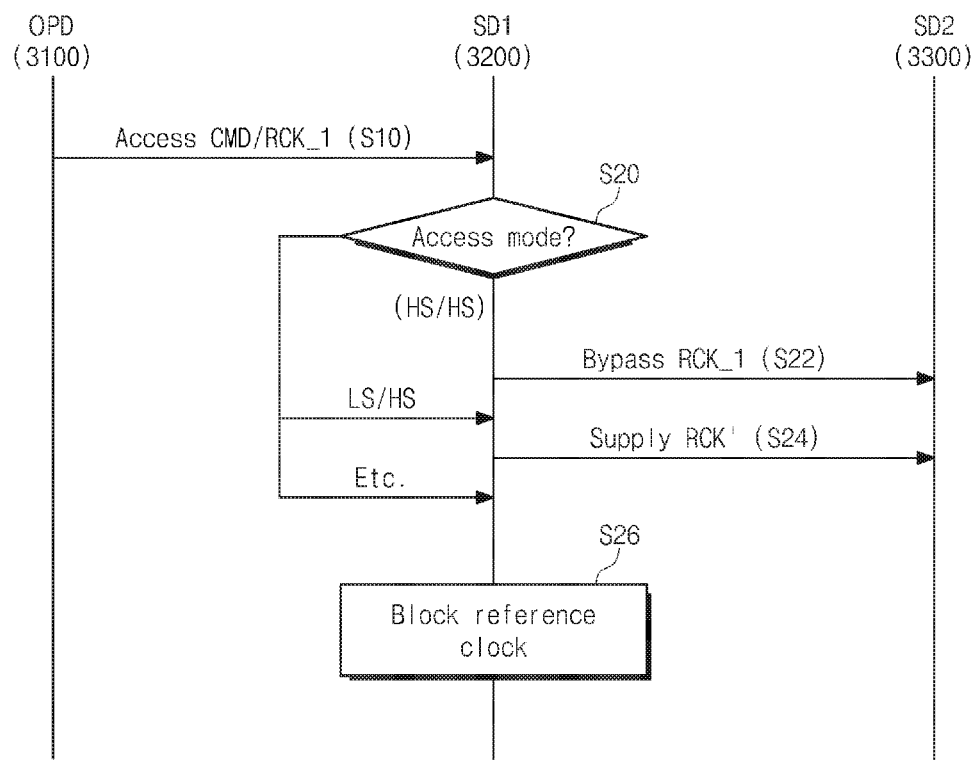
FIG. 12 is a drawing schematically showing a reference clock transmission procedure between devices of the storage system of FIG. 9 according to at least one example embodiment of the inventive concepts.

FIG. 12 is a drawing schematically showing a reference clock transmission procedure between devices of the storage system 3000 of FIG. 9 according to at least one example embodiment. Referring to FIG. 12, the first storage device 3200 may provide the reference clock RCK_2 to the second storage device 3300 regardless of whether the reference clock RCK_1 is provided by the operation processor device 3100.

In operation S10, the operation processor device (OPD) 3100 may transmit a command CMD and/or the reference clock RCK_1 to the first storage device 3200. Through the command CMD, the operation processor device 3100 may directly access only the first storage device 3100, or may indirectly access the second storage device 3300 and/or other additional storage devices (not shown) through the first storage device 3200.

In operation S20, the first storage device 3200 may determine an access mode between devices of the storage system 3000 by using the command CMD and/or the reference clock RCK_1 provided by the operation processor device 3100. Here, an access mode between the operation processor device 3100 and the first storage device 3200 is referred to as a "first access mode", and an access mode between the first storage device 3200 and the second storage device 3300 is referred to as a "second access mode", but the example embodiments are not limited thereto and there may be three or more access modes based on the number of storage devices and/or other devices included in the system in the cascade, daisy chain, chain, and/or serial configuration.

In operation S22, a method of processing a reference clock when the first and second access modes are the high-speed mode (HS/HS) is illustrated. That is, the first storage device 3200 may transmit the reference clock RCK_1 provided by the operation processor device 3100 to the second storage device 3300.

In operation S24, a method of processing a reference clock when the first access mode is in the low-speed mode LS and the second access mode is in the high-speed mode HS (e.g., LS/HS) is illustrated. That is, the first storage device 3200 may transmit a reference clock RCK', which is generated by and/or within the first storage device 3200, to the second storage device 3300.

In operation S26, a method of processing a reference clock in any other access mode which does not correspond to operation S22 and S24, is illustrated. That is, if a request for an access to the second storage device 3300 is absent, transmission of a reference clock to the second storage device 3300 may be blocked regardless of the first access mode (e.g., using an enable EN signal transmitted to the selection logic 3223) according to at least one example embodiment.

Figure 13:
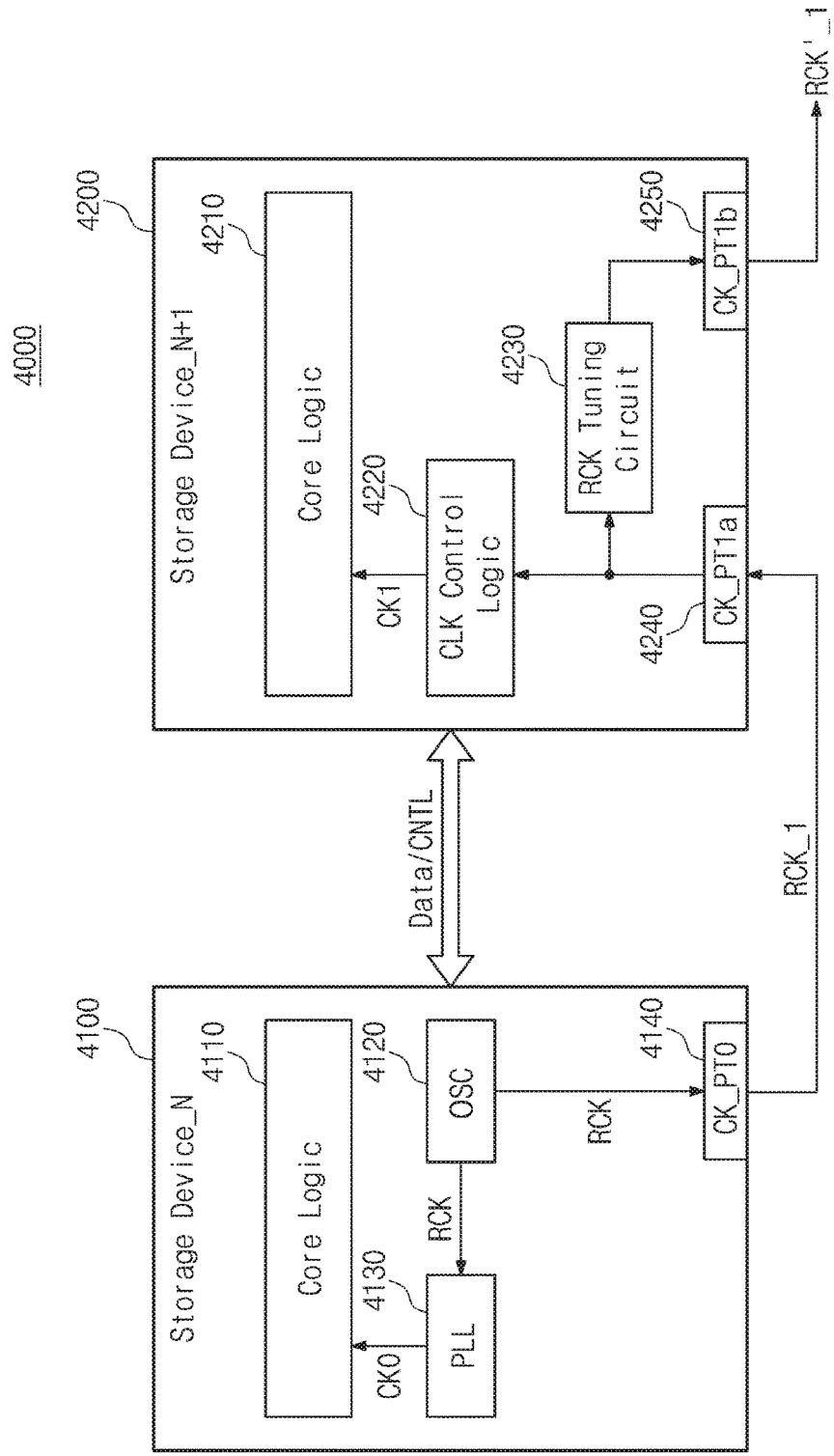
FIG. 13 is a block diagram illustrating a storage system, according to another example embodiment of the inventive concepts.

FIG. 13 is a block diagram illustrating a storage system 4000, according to at least one other example embodiment of the inventive concepts. Referring to FIG. 13, the storage system 4000 may include a first storage device 4100 and a second storage device 4200, but is not limited thereto. According to at least one example embodiment, the first storage device 4100 may generate the reference clock RCK_1 and may transmit the reference clock RCK_1 to the second storage device 4200.

The first storage device 4100 may generate the reference clock RCK_1 and may supply the reference clock RCK_1 to the second storage device 4200 in the cascade manner (e.g., serially, etc.). The first storage device 4100 may include a clock port (e.g., CK_PT0) 4140 for supplying the generated reference clock RCK_1 to the second storage device 4200. The first storage device 4100 may include core logic 4110, an oscillator 4120, a phase locked loop 4130, and the clock port 4140, etc.

Here, the core logic 4110 may include all functions and/or function blocks for processing, storing, and/or converting data of the first storage device 4100. The core logic 4110 includes all functions and/or function blocks for processing data, commands, and/or control signals. For example, the core logic 4110 may include a memory block, a storage controller, or the like.

The oscillator 4120 generates the reference clock RCK_1 within the first storage device 4100. The phase locked loop 4130 generates the clock signal CK0 for driving the core logic 4110 by using the reference clock RCK_1. The first storage device 4100 provides the reference clock RCK_1 to the second storage device 4200 through the clock port 4140 in the cascade manner (e.g., serially, etc.).

The second storage device 4200 may exchange data with the first storage device 4100 in the high-speed serial interfacing manner by using the reference clock RCK_1 provided by the first storage device 4100. The second storage device 4200 may include core logic 4210, a reference clock tuning circuit 4230, and clock ports 4240 and 4250, etc.

Here, the core logic 4210 may include all functions and/or function blocks for processing, storing, and/or converting data. The clock control logic 4220 may generate the clock signal CK1 by using the reference clock RCK_1 provided by the first storage device 4100. The reference clock RCK_1 provided by the first storage device 4100 may be output to the outside through the clock port 4250 after a tuning procedure. Any other device may be coupled with the clock port 4250 in the cascade manner (e.g., serially, etc.).

According to the above-described structure of the storage system 4000, it is possible to generate a reference clock in any one storage device of a plurality of storage devices having the cascade (e.g., serial) topology. The generated reference clock may be transmitted to another storage device of the cascade topology that it exchanges data with.

Figure 14:
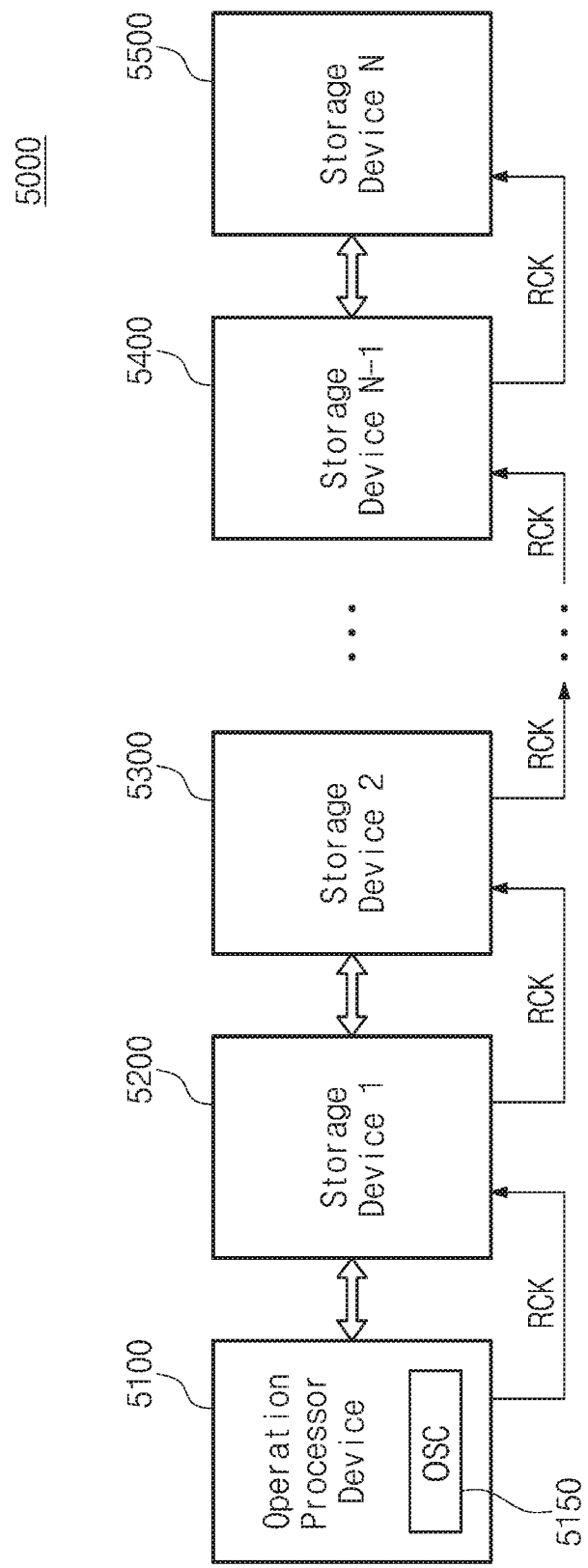
FIG. 14 is a block diagram illustrating an example of a storage system using a cascade manner, according to at least one example embodiment of the inventive concepts.

FIG. 14 is a block diagram illustrating an example of a storage system 5000 using a cascade manner, according to at least one example embodiment of the inventive concepts. Referring to FIG. 14, the reference clock RCK supplied from an operation processor device 5100 is sequentially transmitted to other storage devices in a chain form (e.g., daisy chain configuration).

The operation processor device 5100 may correspond to the operation processor device 1100, 2100, and/or 3100 described with reference to FIG. 1, 4, or 9 according to some example embodiments, but are not limited thereto. The operation processor device 5100 may include an oscillator 5150 for generating the reference clock RCK with a stable frequency therein. Each of storage devices 5200 to 5500 may correspond to the first storage device 1200, 2200, and/or 3200 or the second storage device 1300, 2300, and/or 3300 described with reference to FIG. 1, 4, or 9 according to some example embodiments, but are not limited thereto.

The operation processor device 5100 and the storage devices 5200 to 5500 may be connected to each other through input/output (I/O) ports thereof in the chain form (and/or a daisy chain form, a serial form, etc.). In addition, the operation processor device 5100 and the storage devices 5200 to 5500 may transmit the reference clock RCK in the cascade manner. The operation processor device 5100 that generates the reference clock RCK may correspond to a start point of the cascade. The storage device 5500 that finally receives the reference clock RCK may be situated at a tail end of the cascade. Each of the storage devices may further include a tuning circuit that amplifies a signal level of the reference clock RCK and/or tunes other timing parameters, such as a slew rate, etc.

Figure 15:
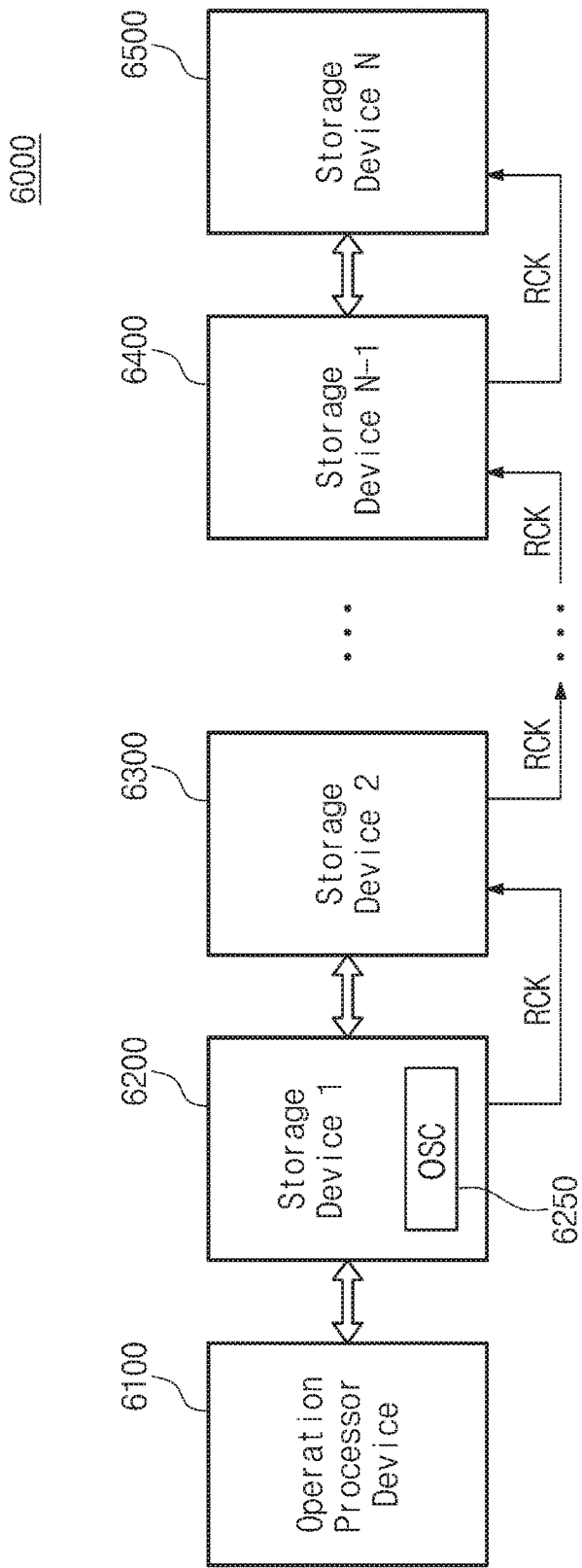
FIG. 15 is a block diagram illustrating another example of a storage system using a cascade manner, according to at least one example embodiment of the inventive concepts.

FIG. 15 is a block diagram illustrating another example of a storage system 6000 using a cascade manner, according to at least one example embodiment of the inventive concepts. Referring to FIG. 15, it is possible to generate the reference clock RCK in any one of a plurality of storage devices 6200 to 6500 regardless of whether a reference clock is supplied from an operation processor device 6100.

The operation processor device 6100 and the storage devices 6200 to 6500 may be connected to each other through data input/output ports in the chain form (e.g., daisy chain, cascade form, a serial manner, etc.). In addition, the operation processor device 6100 and the storage devices 6200 to 6500 may transmit the reference clock RCK in the cascade manner. In particular, even though a reference clock is not provided from the operation processor device 6100, the first storage device 6200 may generate the reference clock RCK and transmit the reference clock RCK to the next storage device. Each of the storage devices may further include a tuning circuit that amplifies the signal level of the reference clock RCK and/or tunes other timing parameters, such as a slew rate, etc.

According to some example embodiments of the inventive concepts, storage devices may provide a reference clock in a chain manner (e.g., daisy chain, serial, cascade manner, etc.). A storage device or a host may be configured to transmit the reference clock only to another storage device (e.g., a second storage device), thereby making it possible to simplify the parameter management of the reference clock. In addition, the quality of the reflectance clock may be improved by reducing and/or minimizing a reflection component and/or a leakage component of the reference clock path.

While the inventive concepts has been described with reference to various example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. An electronic device comprising:
   at least one application processor configured to generate a reference clock signal;
   a first storage device configured to,
      receive the reference clock signal from the at least one application processor through a first clock input port,
      determine whether to output the received reference clock signal from the at least one application processor as a first reference clock signal, or output a generated reference clock signal as the first reference clock signal,
      output the first reference clock signal through a first clock output port based on results of the determining, and
      communicate with the at least one application processor based on the first reference clock signal; and
   a second storage device configured to,
      receive the first reference clock signal from the first clock output port through a second clock input port, and
      communicate with the first storage device using the first reference clock signal.

2. The electronic device of claim 1, wherein the first storage device comprises:
   a first clock control logic configured to transmit the first reference clock signal received through the first clock input port to the first clock output port.

3. The electronic device of claim 2, wherein the first clock control logic is further configured to:
   perform the outputting the received reference clock signal from the at least one application processor as the first reference clock signal, the outputting the received reference clock signal including bypassing the received reference clock signal received through the first clock input port to the first clock output port; or
   perform the outputting the generated reference clock signal as the first reference clock signal, the outputting the generated reference clock signal including generating the generated reference clock signal by tuning the received reference clock signal based on a desired format of the second storage device, and transmitting the tuned reference clock signal to the first clock output port.

4. The electronic device of claim 2, wherein the first clock control logic comprises:
   a phase locked loop configured to generate a second clock signal for driving the first storage device based on the reference clock signal.

5. The electronic device of claim 1, wherein the first storage device comprises:
a serializer/deserializer circuit configured to perform serialization/deserialization for data communication with the at least one application processor or the second storage device based on the received reference clock signal received through the first clock input port.

6. The electronic device of claim 1, wherein the first storage device is configured to block the first clock output port when the at least one application processor does not provide the reference clock signal.

7. The electronic device of claim 1, wherein
the first storage device is an embedded storage device; and
the second storage device is a removable storage device.

8. The electronic device of claim 1, wherein the at least one application processor, the first storage device, and the second storage device are connected using a cascade structure configured to perform serial data communication.

9. An electronic device comprising:
at least one application processor;
a first storage device configured to,
communicate with the application processor,
generate a reference clock signal using an oscillator, and
output the reference clock signal to a clock output port; and
a second storage device configured to,
receive the reference clock signal from the clock output port, and
communicate with the first storage device using the reference clock signal;
wherein the application processor is configured to communicate with the second storage device through the first storage device.

10. The electronic device of claim 9, wherein
the application processor is configured to exchange data with the first storage device in a first communication mode or a second communication mode based on a data transmission speed; and
the second communication mode corresponds to a data transmission speed lower than a data transmission speed of the first communication mode.

11. The electronic device of claim 10, wherein in the first communication mode, the application processor is configured to transmit a first reference clock signal to the first storage device.

12. The electronic device of claim 10, wherein in the second communication mode, the application processor is configured to not provide the first reference clock signal.

13. The electronic device of claim 12, wherein in the second communication mode, the first storage device is configured to provide the second storage device with the reference clock signal generated by the oscillator.

14. The electronic device of claim 12, further comprising:
a reference clock signal transmission path between the application processor, the first storage device, and the second storage device, the reference clock signal transmission path being a cascade topology.

15. The electronic device of claim 9, wherein
the first storage device is an embedded storage device; and
the second storage device is a removable storage device.

16. An electronic device comprising:
at least one processor configured to generate a first reference clock signal; and
a first storage device serially connected to the at least one processor and at least one second storage device, the first storage device configured to,
receive a command or query from the at least one processor,
determine an access mode related to the at least one second storage device based on the received command or query, and
based on results of the determination, transmit a second reference clock signal to the at least one second storage device, the second reference clock signal being the first reference clock signal or a tuned reference clock signal based on the first reference clock signal; and
the at least one second storage device is configured to perform data communication based on the second reference clock signal.

17. The electronic device of claim 16, wherein the determining the access mode includes determining whether the access mode is a high-speed access mode or a low-speed access mode.

18. The electronic device of claim 16, wherein the first storage device is further configured to:
generate the tuned reference clock signal based on a waveform control signal and the first reference clock signal.

19. The electronic device of claim 16, wherein the determining the access mode includes
determining whether the at least one processor requests communication with the at least one second storage device; and
blocking transmission of the second reference clock signal to the at least one second storage device when the at least one processor does not request communication with the at least one second storage device.

20. The electronic device of claim 18, wherein the generating the tuned reference clock signal includes adjusting at least one parameter of a plurality of parameters of the reference clock signal, the plurality of parameters including voltage level, frequency, amplitude, slew rate, duty ratio, and driving strength.

* * * * *